United States Patent [19]

Degeneff et al.

[11] Patent Number: 5,692,158
[45] Date of Patent: Nov. 25, 1997

[54] METHODS FOR GENERATING MODELS OF NON-LINEAR SYSTEMS AND COMPONENTS AND FOR EVALUATING PARAMETERS IN RELATION TO SUCH NON-LINEAR MODELS

[75] Inventors: Robert C. Degeneff, Niskayuna; Moises R. Gutierrez, Troy, both of N.Y.

[73] Assignee: ABB Power T&D Company Inc., Raleigh, N.C.

[21] Appl. No.: 353,478

[22] Filed: Dec. 9, 1994

Related U.S. Application Data

[63] Continuation-in-part of Ser. No. 936,828, Aug. 28, 1992, abandoned.

[51] Int. Cl.$^6$ ............................. G06F 17/50; G06F 9/455
[52] U.S. Cl. ....................................... 395/500; 364/578
[58] Field of Search ...................... 235/151.21; 364/494, 364/578; 395/500

[56] References Cited

U.S. PATENT DOCUMENTS

| | | | |
|---|---|---|---|
| 3,883,724 | 5/1975 | Pradhan et al. | 253/151.21 |
| 5,159,562 | 10/1992 | Putman et al. | 364/494 |
| 5,251,160 | 10/1993 | Rockwood et al. | 364/578 |

OTHER PUBLICATIONS

"Kron's Reduction Method Applied to the Time Stepping Finite Element Analysis of Induction Machines", by Degeneff et al, IEEE Transactions on Energy Conversion, vol. 10, No. 4, Dec. 1995, pp. 669–674.

"Computing the Internal Transient Voltage Response of a Transformer with a Nonlinear Core Using Gear's method, Part 1: Theory", by Vakilian et al, IEEE Transactions on Power Delivery, vol. 10, No. 4, Oct. 1995, pp.1836–1842.

"Computing the Internal Transient Voltage Response of a Transformer with a Nonlinear Core Using Gear's Method, Part 2: Verification", by Vakilian et al, IEEE Transactions on Power Delivery, vol. 10, No. 2, May 1995, pp. 702–708.

"Transformer Model Reduction using Time and Frequency Domain Sensitivity Techniques", by Galarza et al, IEEE Transactions on Power Delivery, vol. 10, No. 2, Apr. 1995, pp. 1052–1059.

"Nonlinear, Lumped Parameter Transformer Model Reduction Technique", by Degeneff et al, IEEE Transactions on Power Delivery, vol. 10, No. 2, Apr. 1995, pp. 862–868.

(List continued on next page.)

*Primary Examiner*—Kevin J. Teska
*Assistant Examiner*—Russell W. Frejd
*Attorney, Agent, or Firm*—Woodcock Washburn Kurtz Mackiewicz & Norris LLP

[57] ABSTRACT

A method for generating a computer model for use in system component design as well as overall system evaluation is disclosed. The method includes the steps of generating an equation model of the system component, modifying the equation model by integrating according to the trapezoidal rule, wherein an integrated model is formed having a plurality of parameter values. Certain of such parameter values define historical parameter values accounting for historical parameter information, the parameter values are arranged in matrix form and reordered. The reorder matrix equation is reduced by eliminating certain of the parameter values, thereby forming a reduced model. When the reduced model is incorporated is a system model it is necessary to modify the system model to account to the component model current parameter information. Such information is used by the component model to update the historical information.

6 Claims, 15 Drawing Sheets

OTHER PUBLICATIONS

"Linear Lumped Parameter Transformer Model Reduction Technique", by Gutierrez et al, IEEE Transactions on Power Delivery, vol. 10, No. 2, Apr. 1995, pp. 853–861.

"A Method for Modeling Nonlinear Core Characteristics of Transformers During Transients", by Vakilian et al, IEEE Transactions on Power Delivery, vol. 9, No. 4, Oct. 1994, pp. 1916–1925.

"A Method for Constructing Reduced Order Transformer Models for System Studies from Detailed Lumped Parameter Models", by Degeneff et al, IEEE Transmission and Distribution 1991 Int'l Conference, pp. 532–538.

"A Method for Constructing Reduced Order Transformer Models for System Studies from Detailed Lumped Parameter Models", by Degeneff et al, IEEE Transactions on Power Delivery, vol. 7, No. 2, Apr. 1992, pp. 649–655.

(a)
DETAILED MODEL (b)
REDUCED MODEL

136 NODE DETAILED TRANSFORMER MODEL: 800 KV METAL OXIDE SURG ARRESTER (SA), $R_g = 10^{-4} \Omega$, $Z_H = 257 \Omega$, $Z_X = 285 \Omega$, $Z_Y = 30 \Omega$

NONLINEAR REDUCED TRANSFORMER MODEL

DETAILED vs. REDUCED MODEL RESPONSES
OPEN CIRCUIT $X_1$

DETAILED vs. REDUCED MODEL RESPONSES
OPEN CIRCUIT AT $Y_1$ ific design (both transient and steady state). Many of these models consist of
METHODS FOR GENERATING MODELS OF NON-LINEAR SYSTEMS AND COMPONENTS AND FOR EVALUATING PARAMETERS IN RELATION TO SUCH NON-LINEAR MODELS

RELATED APPLICATIONS

This is a continuation-in-part of application Ser. No. 07/936,828, filed Aug. 28, 1992, now abandoned.

FIELD OF THE INVENTION

The present invention relates generally to the field of computer based system modelling wherein a non-linear, lumped parameter, or finite element, model is generated and parameter evaluation made based upon such model. In particular, the invention relates to both the evaluation of a non-linear system evaluation and the evaluation of individual non-linear components wherein the non-linear component model utilized for such evaluation has been reduced in size and complexity for inclusion as a part of the overall system model.

BACKGROUND OF THE INVENTION

For purposes of illustration, the present invention is described in relation to non-linear lumped parameter and finite element systems used to model power transmission systems and components thereof, particularly transformers. This description is intended to illustrate the invention and not to limit application of the invention solely to power transmission components. It is noted that the present invention will find application in evaluations using any type of non-linear lumped parameter or finite element model.

High failure rates for EHV transformers of 2.3% per year/phase for 765 Kv GSU's when compared to lower rates for lower voltage units (0.7% per year for 345 Kv GSU's) is of significant concern to the utility industry. As described in L. B. Wagener, et al., *Rationale and Implementation of a New 765 kV Generator Step-up Transformer Specification*, CIGRE, 12-202, August, 1990, considerable effort has been spent investigating the cause of these failures. While no single reason has been identified as the cause of these high failure rates, it has been observed by American Electric Power (AEP) that for its systems over 90% of these failures are related to electrical breakdown of the transformer insulation, i.e., dielectric material, due to effects of transient conditions. Such interest is understandable, when one considers the high cost of these EHV transformers, on the order of several million dollars each.

In order to predict transformer operation in the design phase, i.e. to predict transformer failure under factor test conditions, transformer designers have almost exclusively for the past two decades used a variety of computer based models to determine, i.e., compute, the transformer internal transient voltage response to standard test waveforms. Such computer modeling has included computer models directed to the development of a transformer's dielectric design (both transient and steady state). Many of these models consist of large, multi-nodal networks of linear, lumped, resistances (R), inductances (L), and capacitances (C) parameters, each of which account for losses of varying degree. H. W. Dommel, *Digital Computer Solution of Electromagnetic Transients in Single and Multiphase Networks*, IEEE Transactions on Power Apparatus and Systems, Vol. PAS-88, No. 4, April 1969 described how such a model can be solved mathematically. Models of this type may contain several hundred nodes for each voltage phase, which detail is necessary for proper insulation design.

A standard, industry accepted, computer program model generated using the Dommel methodology is referred to as an electro-magnetic transients program (EMTP). EMTP models have been found to be reasonably accurate for standard lightning and switching impulse tests. Unfortunately, problems can arise when it is desired to evaluate how the final transformer design will operate within a power transmission system.

When performing system studies, i.e. a study of the overall power transmission and distribution system, utility engineers will also utilize computer based models in order to evaluate system operation. In such studies, the utility engineer, similar to the transformer designer, needs to represent the power transformer in some detail. However, it is impractical to incorporate the detailed model used for dielectric design in the system model because of the size and resultant computational burden of the transformer model. Accordingly, utility engineers have used smaller or reduced order models of transformers in performing such system studies. Unfortunately, most reduced transformer models have rather poor agreement with measured results on fully assembled transformers.

Presently used reduced order models are either generated from transformer name plate characteristics or generated by greatly simplifying the detailed models used in the transformer insulation design. However, it should be noted that this modeling method has impedance versus frequency characteristics which have been found to be in considerable error when compared to the impedance versus frequency characteristics exhibited by the detailed model and the detailed models impedance versus frequency characteristic closely agrees with the characteristic of the physical transformer. One method for generating a transformer model in relation to terminal characteristics is disclosed in A. Morched, et al. *A High Frequency Transform Model for EMTP*, IEEE Summer Power Meeting, Paper 92SM 359-0-PWRD, Seattle, Wash., July 1992. Unfortunately, one problem with using the terminal characteristic methods is that the resulting model does not allow the interaction of the system and transformer to be fully or accurately explored prior to the transformer construction.

The transient waveform which a transmission system places on the transformer is a function of both system characteristics and the transformer impedance characteristic. Therefore, a reduced model which more faithfully represents the impedance characteristic of the transformer is required to perform more realistic system studies. R. C. Degeneff, et al., *A Method for Constructing Reduced Order Transformer Models for System Studies from Detailed Lumped Parameter Models*, IEEE/PES T&D Convention, Dallas Tex., pp. 22–27 presented a method of constructing a reduced order model which allowed the user to select the accuracy bandwidth of the model. The shortcoming of this method is that at high frequencies (e.g., chopped waveforms) the detail that must be retained forces the resultant reduced model to be large which defeats the purpose of the reduction effort.

It will be appreciated from the above that knowledge of a transformer's response to the various voltage waveforms impressed upon it in service is very valuable to the design engineer. If the power engineer could provide the transformer designer with such information early in the design stage, it would improve the final transformer design, i.e., failure rate, significantly. One method of achieving this result is to have the power and design engineers employ the same detailed transformer model or an equivalent reduced model in both system and design studies. As previously indicated, such a situation is computationally prohibitive.

Since the nonlinear characteristics of the transformer can have an effect on the terminal voltage and impedance characteristic, it is important to capture both the nonlinear and wideband characteristic of the transformer in a reduced model. Therefore, a methodology is needed to reduce the size of the nonlinear lumped parameter transformer model used for insulation design to the point where it can be used in utility system studies without affecting the computed result.

Consequently, what is needed in the industry is an accurate, wideband, lossy, nonlinear detailed model that can be used by the transformer design engineer, and a corresponding high fidelity, reduced model that can be utilized by the power system engineer but which yields the same test results as the detailed model. As can be seen from the above, no method of reduction has been proposed that addresses both the nonlinear and frequency dependent characteristics required of a reduced order model necessary to study the switching surge response of transformers embedded in power systems.

The invention presents methods which start with a detailed lumped parameter LRC non-linear model and reduces it to a size suitable for use in utility system studies. The contribution of this method is that the accuracy of the computed results with the reduced non-linear model is essentially identical to the detailed model used in design studies. This allows the utility engineer to develop an accurate picture of the transients at the terminals of the transformer which are a function of both the system and the transformer. This can be accomplished prior to transformer construction allowing the designer time to modify the design if necessary in response to more realistic system generated waves.

It is noted that the reduction technique utilized in the present invention is based in part on an extension of the work described in G. Kron, *Diakoptics, The Piecewise Solution of Large-Scale Systems*, MacDonald, London, 1963, in combination with the trapezoidal rule of integration.

SUMMARY OF INVENTION

This invention provides a novel method for generating a computer model for use in system component design as well as overall system evaluation is disclosed. The method includes the steps of generating an equation model of the system component, modifying the equation model by integrating according to the trapezoidal rule, wherein an integrated model is formed having a plurality of parameter values. Certain of such parameter values define historical parameter values accounting for historical parameter information. The parameter values are arranged in matrix form and reordered. The reorder matrix equation is reduced by eliminating certain of the parameter values, thereby forming a reduced model. When the reduced model is incorporated is a system model it is necessary to modify the system model to account to the component model current parameter information. Such information is used by the component model to update the historical information.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which.

DETAILED DESCRIPTION OF THE INVENTION

Figure 1:
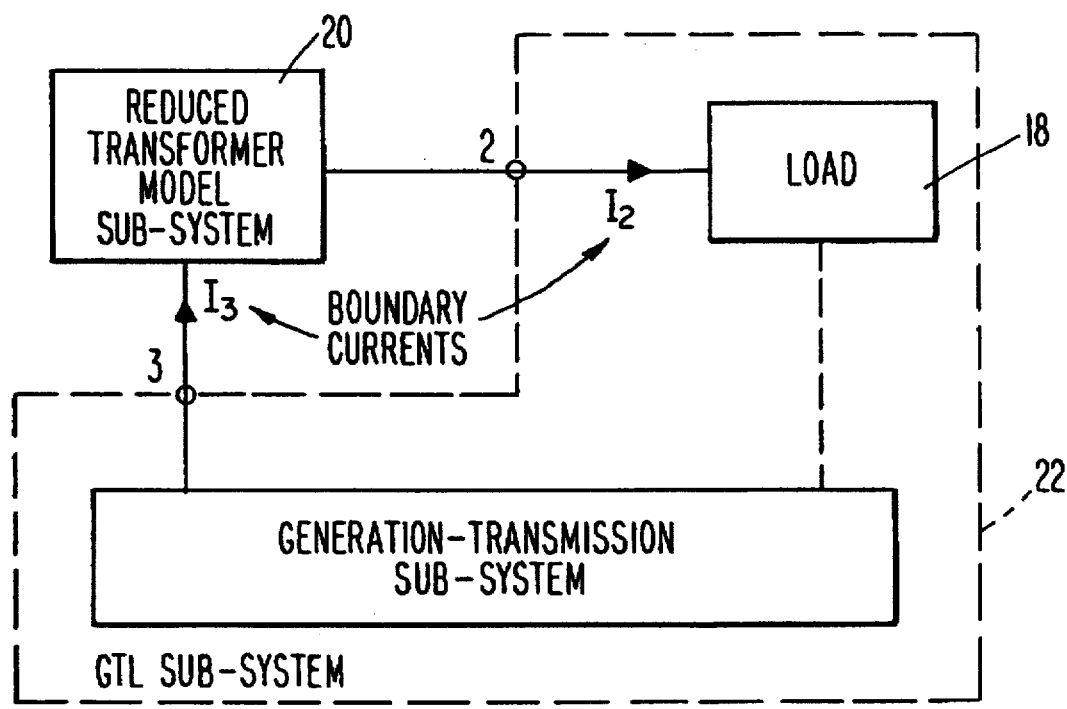
FIG. 1 is a block diagram of a transformer - power transmission system modelled in accordance with the invention.

As indicated above this application is a continuation-in-part application of Ser. No. 07/936,828. In that application methods were described for generating reduced models in relation to systems and components having linear characteristics. The present invention addresses systems and components having non-linear characteristics. Since many of the features of the linear reduced models are utilized, the linear related methods are described first.

It is initially noted that the present invention will be implemented preferably in software for use with any general purpose computer having a CPU, an input device (keyboard), a display device (CRT) or other means of displaying results, such as a printer, and which is capable of performing the software operations described below. To that end, the invention can be viewed as a general purpose computer which is operated in accordance with programming incorporating the invention. Since computers of the type necessary to perform the operations described below are known, no further detailed description is made herein. Similarly, since software languages capable of performing the operations described below are known, no further description is necessary.

LINEAR MODELING

The ability of a detailed computer model to faithfully reproduce the transient characteristic of a transformer depends upon two independent model characteristics. First, the model must accurately provide R, L, and C representations which are appropriate for the transformer geometry. Second, the model must possess sufficient detail to adequately represent the frequency response of the transformer for the applied waveshape. This last, often overlooked, point can produce results which appear to be mathematically valid, but which may have little physical basis.

This second condition is required to meet the necessary assumption for a valid lumped parameter model is that the system must be quasi-static. In other words, the highest frequency for which the network is valid must have a period at least ten times greater than the travel time of the largest element (or division) in the model. It has been noted in W. J. McNutt et al. *Response of Transformer Windings to System Voltages*, IEEE PAS-93, Mar./Apr. 1972, pp. 457–467 that for a model to predict with reasonable accuracy, the switching surge response it must be valid to at least 10 kHz; 50 kHz for a full wave; and 250 kHz for a chopped wave. It will be recognized that 95% of the energy in the applied wave is contained below these frequencies.

The steady state and transient behavior of a circuit, for any applied voltage, is established by the poles and zeros of the circuit impedance in the complex frequency plane. If a reduced order model of a transformer is to reproduce the transient voltage characteristics of the detailed model, the reduced model must respond with essentially the same poles and zeros in its terminal impedance and transfer function as the complete model over the frequency range of interest. In the past, this relationship has not been emphasized and, if not appreciated, will lead to a conclusion that reduction techniques apply over a much wider frequency range than is, in fact, the case. This has been the most difficult challenge in creating a reduced order model which retains the response characteristic of a detailed model, since, for a static lumped parameter model as the size of the model reduces, the number of valid eigenvalues must also decease. This makes the static reduced order model intrinsically less accurate.

The reduction technique used in the present invention is based on an extension of Kron's work (identified previously) in combination with the trapezoidal rule of integration. The results which have been obtained include a model having a group of lumped elements and injected currents which are a function of the total transformer topology and past current history. This combination of reduced network elements and injected currents allows a transformer network to be reduced to any degree with no loss of response accuracy. As will be discussed, the results have been compared with the transient voltage response and frequency characteristics of the detailed model used as a reference.

LINEAR REDUCTION

For any network of general construction containing linear coupled inductances, resistors, capacitors, and transmission lines, a system of linear equations can be written by preparing a system of differential equations and integrating such equations in accordance with any known method of integration which produces a series of parameter values. In the preferred embodiment, the trapezoidal rule is used. Such equations will describe the function of the nodal voltages and branch currents. Expressing these equations in matrix form leads to:

$$[Y][F(t)] = [i(t)] - [H]; \qquad (1)$$

with:

[Y]=Equivalent nodal admittance matrix in the time domain

[F(t)]=Column vector of a function of node voltages

[i(t)]=Column vector of current sources

[H]=Column vector representing the "past history" of the network.

Equation (1) can have at least three different forms:

$$\text{integral of the voltage } [\Gamma_n][\phi(t)] = [i(t)] - [\bar{H}] \qquad (1a)$$

$$\text{voltage } [G][v(t)] = [i(t)] - [H] \qquad (1b)$$

$$\text{derivative of the voltage } [C][\dot{v}(t)] = [i(t)] - [\hat{H}] \qquad (1c)$$

with:

$[\Gamma_n]$=equivalent inverse nodal inductance matrix

[G]=equivalent nodal conductance matrix

[C]=equivalent nodal capacitance matrix $[\bar{H}]$, [H], $[\hat{H}]$=current history vectors for the various formulation and $$[v(t)] = \frac{d}{dt}[\phi(t)] \text{ and } [\dot{v}(t)] = \frac{d}{dt}[v(t)] = \frac{d^2}{dt^2}[\phi(t)]$$

Equation (1b) is the basis for the EMTP, mentioned previously as being described by Dommel. Equation (1a) can form the basis for a transformer time domain transients program. Equation (1c) provides advantage in a network predominately capacitive or in a state variable formulation by combining equations (1b) and (1c).

For purposes of illustrating the invention, the conductance/voltage form will be used, which is consistent with EMTP. However, it should be kept in mind that the results are general and, in fact, the validation results were made with both the integral of voltage formulation and the conductance formulation.

The detailed lumped parameter transformer model can be visualized as an RLC network and can be represented in the time domain by equation (1b) where the equivalent nodal conductance matrix is a function of the time step ($\Delta t$), the nodal capacitance matrix, the nodal conductance matrix and the inverse nodal inductance matrix.

The nodes in the model can be thought of as either internal nodes or boundary nodes. Internal nodes are those which have no external connection and their associated nodal injected current is zero. Boundary nodes are those which connect the transformer to the external circuit, (i.e. transmission system or loads).

The current vector [i(t)] of equation (1b) is relatively sparse since the number of internal nodes is generally larger than the number of boundary nodes, even for three-phase multi-windings transformers. In the present invention, many of the internal nodes from equation (1b) are eliminated. With this reduced model it is possible to reproduce the detailed lumped parameter transformer models response exactly.

Equation (1b) for a power transformer has the following form:

$$\begin{bmatrix} Y_{11} & Y_{12} & Y_{13} \\ Y_{21} & Y_{22} & Y_{23} \\ Y_{31} & Y_{32} & Y_{33} \end{bmatrix} \begin{bmatrix} V_1 \\ V_2 \\ V_3 \end{bmatrix} = \begin{bmatrix} 0 \\ -I_2 \\ I_3 \end{bmatrix} - \begin{bmatrix} H_1 \\ H_2 \\ H_3 \end{bmatrix} \quad (2)$$

where subscript 1 represents internal nodes to be discarded, subscript 2 represents output nodes to be retained and, subscript 3 represents input nodes to be kept.

The Kron reduction technique is used in the present invention as follows:

First, the equivalent admittance matrix is reordered as follows:

First the matrix and vectors are partitioned:

$$\begin{bmatrix} Y_{22} & Y_{23} & | & Y_{21} \\ Y_{32} & Y_{33} & | & Y_{31} \\ \hline Y_{12} & Y_{13} & | & Y_{11} \end{bmatrix} \begin{bmatrix} V_2 \\ V_3 \\ \hline V_1 \end{bmatrix} = \begin{bmatrix} -I_2 \\ I_3 \\ \hline 0 \end{bmatrix} - \begin{bmatrix} H_2 \\ H_3 \\ \hline H_1 \end{bmatrix} \quad (2a)$$

Partitioning yields:

$$\begin{bmatrix} Y_{22} & Y_{23} \\ Y_{32} & Y_{33} \end{bmatrix} \begin{bmatrix} V_2 \\ V_3 \end{bmatrix} + \begin{bmatrix} Y_{21} \\ Y_{31} \end{bmatrix} [V_1] = \begin{bmatrix} -I_2 \\ I_3 \end{bmatrix} - \begin{bmatrix} H_2 \\ H_3 \end{bmatrix} \quad (2b)$$

$$[Y_{12}\ Y_{13}] \begin{bmatrix} V_2 \\ V_3 \end{bmatrix} + [Y_{11}][V_1] = -[H_1] \quad (2c)$$

Eliminating $V_1$ yields:

$$[V_1] = -[Y_{11}]^{-1}[Y_{12}\ Y_{13}] \begin{bmatrix} V_2 \\ V_3 \end{bmatrix} - [Y_{11}^{-1}][H_1]$$

$$\begin{bmatrix} Y_{22} & Y_{23} \\ Y_{32} & Y_{33} \end{bmatrix} \begin{bmatrix} V_2 \\ V_3 \end{bmatrix} +$$

$$\begin{bmatrix} Y_{21} \\ Y_{31} \end{bmatrix} \left\{ -[Y_{11}]^{-1}[Y_{12}\ Y_{13}] \begin{bmatrix} V_2 \\ V_3 \end{bmatrix} - [Y_{11}]^{-1}[H_1] \right\} =$$

$$\begin{bmatrix} -I_2 \\ I_3 \end{bmatrix} - \begin{bmatrix} H_2 \\ H_3 \end{bmatrix}$$

$$\left\{ \begin{bmatrix} Y_{22} & Y_{23} \\ Y_{32} & Y_{33} \end{bmatrix} - \begin{bmatrix} Y_{21} \\ Y_{31} \end{bmatrix} [Y_{11}]^{-1}[Y_{12}\ Y_{13}] \right\} \begin{bmatrix} V_2 \\ V_3 \end{bmatrix} =$$

$$\begin{bmatrix} -I_2 \\ I_3 \end{bmatrix} = \left\{ \begin{bmatrix} H_2 \\ H_3 \end{bmatrix} - \begin{bmatrix} Y_{21} \\ Y_{31} \end{bmatrix} [Y_{11}]^{-1}[H_1] \right\}$$

Therefore, applying the Kron reduction technique, in accordance with the present invention, to equation (2) yields:

$$\begin{bmatrix} Y_{22} - Y_{21} Y_{11}^{-1} Y_{12} & Y_{23} - Y_{21} Y_{11}^{-1} Y_{13} \\ Y_{32} - Y_{31} Y_{11}^{-1} Y_{12} & Y_{33} - Y_{31} Y_{11}^{-1} Y_{13} \end{bmatrix} \begin{bmatrix} V_2 \\ V_3 \end{bmatrix} = \quad (3)$$

$$\begin{bmatrix} -I_2 \\ I_3 \end{bmatrix} - \begin{bmatrix} H_2 - Y_{21} Y_{11}^{-1} H_1 \\ H_3 - Y_{31} Y_{11}^{-1} H_1 \end{bmatrix}$$

Equation (3) represents the reduced model of the power transformer where boundary nodes and select internal nodes are retained. However, the influence of eliminated internal nodes in the response of the transformer is implicit in both the equivalent reduced admittance matrix and the current history vector, so that this reduced model represents accurately the original detailed network exactly. One advantage of this method is that there is no approximation used in the derivation of the reduced model.

This reduction method is suitable for EMTP studies because it represents a network composed of conductances between boundary nodes with time dependent current sources. This network is of the type that is used in EMTP to model any passive lumped parameter networks. The reduced network in equation (3), derived from the equivalent reduced admittance matrix, is only a function of the time step ($\Delta t$), and it is invariant as long as the parameters [C], [G], [$\Gamma$] and $\Delta t$ remain unchanged.

Consider next the ability to reduce the transformer model and interface that reduced model with a conventional LRC network model or a system model. FIG. 1 shows a system composed of a generation system, a transmission system, a transformer (not separately shown) and a load 18. It is possible to divide this system into two subsystems, namely, a transformer subsystem 20 and GTL (Generation-Transmission-Load) subsystem 22.

Separating the transformer 20 from the system 22, and replacing it by the boundary currents, it is possible to apply equation (1b) to Generation-Transmission-Load (GTL) subsystem 22, indicated by the area enclosed by the dotted line yielding:

$$\begin{bmatrix} y_{11} & y_{12} & y_{13} \\ y_{21} & y_{22} & y_{23} \\ y_{31} & y_{32} & y_{33} \end{bmatrix} \begin{bmatrix} v_1 \\ v_2 \\ v_3 \end{bmatrix} = \begin{bmatrix} i_1 \\ i_2 \\ -i_3 \end{bmatrix} - \begin{bmatrix} h_1 \\ h_2 \\ h_3 \end{bmatrix} \quad (4)$$

Separating GTL subsystem 22 from the transformer subsystem 20, and replacing it by the boundary currents, the equation for the transformer becomes:

$$\begin{bmatrix} Y_{11} & Y_{12} & Y_{13} \\ Y_{21} & Y_{22} & Y_{23} \\ Y_{31} & Y_{32} & Y_{33} \end{bmatrix} \begin{bmatrix} V_1 \\ V_2 \\ V_3 \end{bmatrix} = \begin{bmatrix} 0 \\ -I_2 \\ I_3 \end{bmatrix} - \begin{bmatrix} H_1 \\ H_2 \\ H_3 \end{bmatrix} \quad (5)$$

where upper case letters represent transformer variables and lower case letters represent variables for the GTL subsystem 22. The adopted sign current convention is that current into a node is positive. Note also that boundary currents are equal in magnitude but opposite in sign, and boundary voltage functions (i.e., $v_2=V_2$, $v_3=V_3$) are equal for both subsystems 20 and 22.

By eliminating the internal node voltage function $V_1(t)$ from equation (5) by applying the Kron reduction technique of the present invention, and by eliminating the boundary currents (i.e., $I_2$, $I_3$) by using equation (4), the entire system equation can be obtained as follows:

Applying the equivalent Kron reduction technique to equation (2), we have:

$$\begin{bmatrix} \bar{Y}_{22} & \bar{Y}_{23} \\ \bar{Y}_{32} & \bar{Y}_{33} \end{bmatrix} \begin{bmatrix} V_2 \\ V_3 \end{bmatrix} = \begin{bmatrix} -I_2 \\ I_3 \end{bmatrix} - \begin{bmatrix} \bar{H}_2 \\ \bar{H}_3 \end{bmatrix} \quad (5a)$$

with:

$$\bar{Y}_R = \begin{bmatrix} \bar{Y}_{22} & \bar{Y}_{23} \\ \bar{Y}_{32} & \bar{Y}_{33} \end{bmatrix} = \begin{bmatrix} Y_{22} - Y_{21} Y_{11}^{-1} Y_{12} & Y_{23} - Y_{21} Y_{11}^{-1} Y_{13} \\ Y_{32} - Y_{31} Y_{11}^{-1} Y_{12} & Y_{33} - Y_{31} Y_{11}^{-1} Y_{13} \end{bmatrix} \quad (5b)$$

and $$H_H = \begin{bmatrix} \bar{H}_2 \\ \bar{H}_3 \end{bmatrix} = \begin{bmatrix} H_2 - Y_{21} Y_{11}^{-1} H_1 \\ H_3 - Y_{31} Y_{11}^{-1} H_1 \end{bmatrix}$$

$$[y_{11}][v_1] + [y_{12} \; y_{13}] \begin{bmatrix} v_2 \\ v_3 \end{bmatrix} = [i_1] - [h_1] \quad (5c)$$

$$\begin{bmatrix} y_{21} \\ y_{31} \end{bmatrix} [v_1] + \begin{bmatrix} y_{22} & y_{23} \\ y_{32} & y_{33} \end{bmatrix} \begin{bmatrix} v_2 \\ v_3 \end{bmatrix} = \begin{bmatrix} i_2 \\ -i_3 \end{bmatrix} - \begin{bmatrix} h_2 \\ h_3 \end{bmatrix} \quad (5d)$$

Eliminating the boundary currents between equations 5a and 5b we obtain:

Combining equation 5c with 5e we have
Finally yielding:

$$\begin{bmatrix} y_{21} \\ y_{31} \end{bmatrix} [v_1] + \begin{bmatrix} y_{22}+\bar{Y}_{22} & y_{23}+\bar{Y}_{23} \\ y_{32}+\bar{Y}_{32} & y_{33}+\bar{Y}_{33} \end{bmatrix} \begin{bmatrix} v_2 \\ v_3 \end{bmatrix} = \begin{bmatrix} h_2+\bar{H}_2 \\ h_3+\bar{H}_3 \end{bmatrix} \quad (5e)$$

$$\begin{bmatrix} y_{11} & y_{12} & y_{13} \\ y_{21} & y_{22}+\bar{Y}_{22} & y_{23}+\bar{Y}_{23} \\ y_{31} & y_{32}+\bar{Y}_{32} & y_{33}+\bar{Y}_{33} \end{bmatrix} \begin{bmatrix} v_1 \\ v_2 \\ v_3 \end{bmatrix} = \begin{bmatrix} i_1 \\ 0 \\ 0 \end{bmatrix} - \begin{bmatrix} h_1 \\ h_2+\bar{H}_2 \\ h_3+\bar{H}_3 \end{bmatrix}$$

$$\begin{bmatrix} y_{11} & y_{12} & y_{13} \\ y_{21} & y_{22}+Y_{22}-Y_{21}Y_{11}^{-1}Y_{12} & y_{23}+Y_{23}-y_{21}Y_{11}^{-1}Y_{13} \\ y_{31} & y_{32}+Y_{32}-Y_{31}Y_{11}^{-1}Y_{12} & y_{33}+Y_{33}-Y_{31}Y_{11}^{-1}Y_{13} \end{bmatrix} *$$

$$\begin{bmatrix} v_1 \\ v_2 \\ v_3 \end{bmatrix} = \begin{bmatrix} i_1 \\ 0 \\ 0 \end{bmatrix} - \begin{bmatrix} h_1 \\ h_2+H_2-Y_{21}Y_{11}^{-1}H_1 \\ h_3+H_3-Y_{31}Y_{11}^{-1}H_1 \end{bmatrix} \quad (6)$$

Equation (6) illustrates that the transformer can be represented by its equivalent time-domain reduced model (equation (3)), and used in a more complex system representation. Equation (6) also shows that Generation-Transmission-Load subsystem 22 is modeled in the time domain solution method in the usual manner, and that the reduced but accurate transformer model is just inserted in parallel among boundary nodes as an equivalent network with time-dependent current sources.

Figure 2:
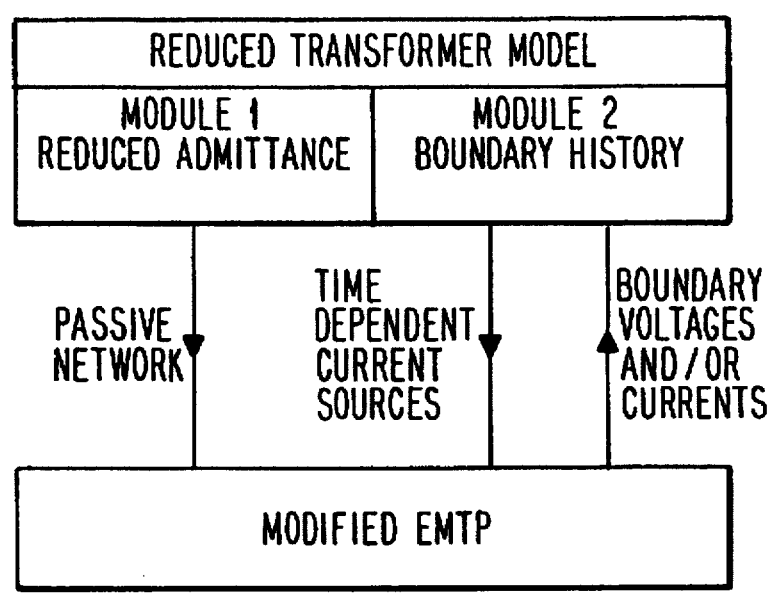
FIG. 2 is a more detailed block diagram of the transformer/system depicted in FIG. 1.

FIG. 2 shows schematically the functional relationship between the modified solution method and the reduced model in the time domain for a power transformer.

Module 1 reduces the detailed admittance matrix by the reduction technique outlined in equations 1-3 and provides a passive network of conductances between boundary nodes. It is a function of the boundary nodes, the time step, the nodal capacitance matrix, the nodal conductance matrix and the inverse nodal inductance matrix. In most cases this computation will be performed once since $\Delta t$ remains constant if the model is linear and time invariant. If the topology of the transformer changes, or the time step changes, the calculation must be repeated.

Module 2 updates history current vector at each time step, once boundary currents or voltages are known, and provides a network of time dependent current sources injected at each boundary nodes from ground. This network is a function of the detailed admittance matrix, and past history.

Past history can be calculated in several ways. The common approach consists of calculating "past history" associated with each branch element as if it were a current source in parallel, by the equations given in the Dommel and Degeneff references identified above. This parallel current source is decomposed into two current sources of the same magnitude but opposite in sign and injected to each branch node element from ground according to the current sign convention. The preferred approach is a matrix approach instead of a branch by branch approach.

The detailed linear lossy lumped parameter transformer (or network) model can be thought of as composed of three sub-networks in parallel: inductance, conductance, and capacitance sub-network. Each sub-network is treated independently and its associated injected nodal current vector can be calculated. Adding up all three injected nodal current vectors, the total injected nodal current vector is obtained.

The described nodal equation in EMTP (voltage) form for these subnetworks are indicated in the following equations when series inductance losses are not considered:

Inductance sub-network:

$$[I_L(t)] = \frac{\Delta t}{2} [\Gamma][E(t)] + [H_L(t-\Delta t)] \quad (7a)$$

$$[H_L(t-\Delta t)] = \frac{\Delta t}{2} [\Gamma][E(t-\Delta t)] + [I_L(t-\Delta t)] \quad (7b)$$

Conductance subnetwork:
$$[I_R(t)] = [G][E(t)] \quad (8)$$

Capacitance subnetwork:

$$[I_c(t)] = \frac{2}{\Delta t} [C][E(t)] + [H_c(t-\Delta t)] \quad (9a)$$

$$[H_c(t-\Delta t)] = -\frac{2}{\Delta t} [C][E(t-\Delta t)] - [I_c(t-\Delta t)] \quad (9b)$$

The describing equations of the entire network are shown in equation 10a through 10d.

$$[I(t)] = [Y(\Delta t)][E(t)] + [H(t-\Delta t)] \quad (10a)$$

with
$$[I(t)] = [I_L(t)] + [I_R(t)] + [I_c(t)] \quad (10b)$$

$$[Y(\Delta t)] = \frac{\Delta t}{2} [\Gamma] + [G] + \frac{2}{\Delta t} [C] \quad (10c)$$

$$[H(t-\Delta t)] = [H_L(t-\Delta t)] + [H_c(t-\Delta t)] \quad (10d)$$

Equations 7b and 9b can be rearranged as indicted in equation 11a and 11b respectively:

$$[H_L(t-\Delta t)] = 2[I_L(t-\Delta t)] - [H_L(t-2\Delta t)] \quad (11a)$$

$$[H_c(t-\Delta t)] = \frac{-4[C]}{\Delta t} [E(t-\Delta t)] = [H_c(t-2\Delta t)] \quad (11b)$$

Equation 10d can be written as:

$$[H(t-\Delta t)]+[H(t-2\Delta t)]=[H_L(t-\Delta t)]+[H_L(t-2\Delta t)]+[H_c(t-\Delta t)]+[H_c(t-2\Delta t)] \quad (12)$$

substituting equations 10a, 11a and 11b into 12 yields $$[H(t-\Delta t)]=2[I_L(t-\Delta t)]-[A_1][I(t-\Delta t)]+[A_2][H(t-2\Delta t)] \quad 13$$

with:

$$[A_1] = \frac{4}{\Delta t} [C][Y^{-1}]$$

$$[A_2] = [A_1] - [1]$$

Replacing equation 7b into 7a and by equation 10a yields:

$$[I_L(t)]=[A_3]\{[I(t)]-[H(t-\Delta t)]+[I(t-\Delta t)]-[H(t-2\Delta t)]\}+[I_L(t-\Delta t)]$$

with:

$$[A_3] = \frac{\Delta t}{2} [\Gamma][Y^{-1}]$$

Note that $[A_1]$, $[A_2]$ and $[A_3]$ are constant matrices and are calculated once.

The detailed lumped parameter transformer model is visualized as an RLC network whose initial conditions are determined by the energy of all capacitances and inductances at time equal zero:

$$[E(0)], [I_L(0)] \text{ and } [I(0)];$$

where the injected nodal current of the inductance subnetwork is calculated by equation 4a at t=0

$$[I_L(0)]=[T_{nb}] [i(0)] \quad \quad 14a$$

with

[$T_{nb}$]—connection matrix and

[i(0)]—winding current segment vector at t=0.

From equation 10a at t=0 we have:

$$[H(-\Delta t)]=[I(0)]-[Y(\Delta t)] [E(0)] \quad \quad 14b$$

Inserting 14b into 13 at t=Δt we have:

$$[H(0)]=2[I_L(0)]-[I(0)]-\{(4/\Delta t)[C]-[Y]\} [E(0)] \quad \quad 14c$$

In sum a generation-transmission-transformer-load power system can be divided into two subsystems: one consisting of the generation-transmission-load (GTL) model, and the other being the reduced transformer model. Both can be analyzed and solved in parallel by replacing one of the subsystems with the appropriate boundary currents. For EMTP studies, the transformer subsystem can be modeled in a modified version of the EMTP by a passive network of admittances and associated time dependent current sources, whereas the GTL subsystem is modeled in the usual EMTP manner. At the beginning of an EMTP simulation, the admittance matrix for the detailed model is reduced by Module 1, while Module 2 initializes the boundary history vector (see FIG. 2). This information is passed to the EMTP where it is represented by a passive network of admittances with time dependent current sources. The boundary history vector must be updated at each time step, whereas the reduced admittance matrix is constant as long as the time step and transformer network parameters are constant. Therefore, at the end of each time step, the modified EMTP must pass the instantaneous values of the boundary voltages or currents to Module 2, where it computes the boundary history vector for the next time step and then passes that information back to the EMTP.

EXAMPLE 1

Comparisons have been made between a detailed transformer model used for insulation design and a reduced model of a single-phase, core form, 500 MVA, 765/345/34.5 kV YYD autotransformer, which was constructed by ABB for AEP.

Figure 3:
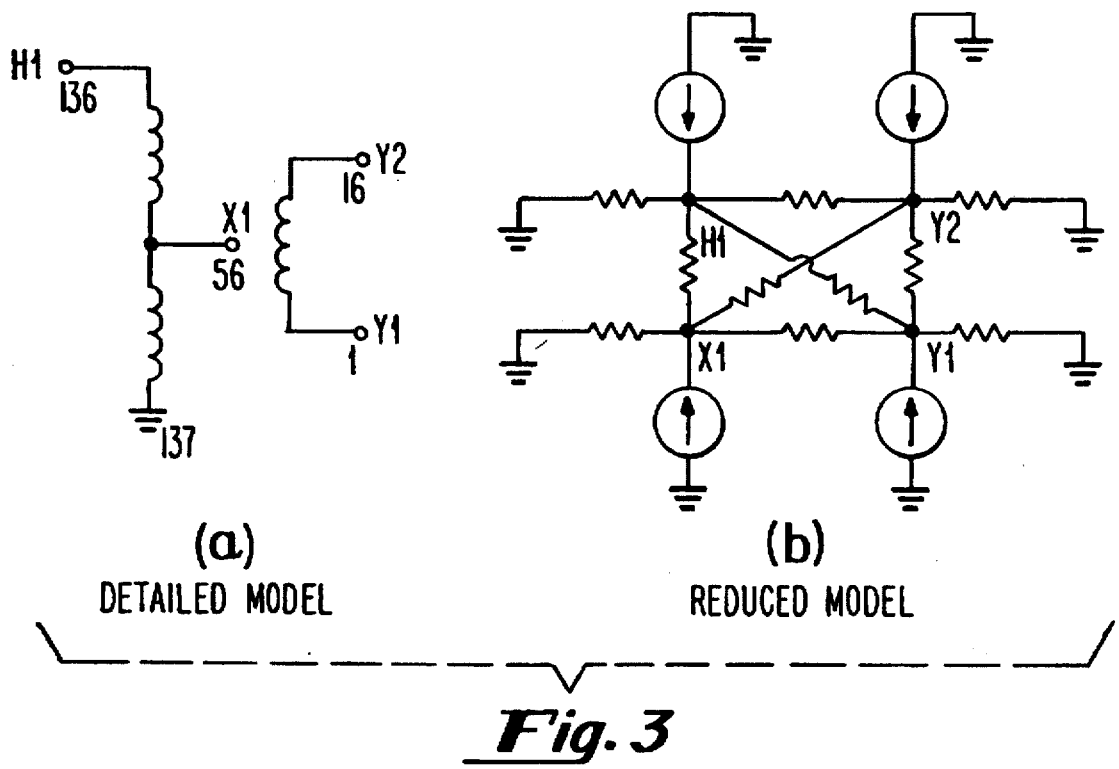
FIG. 3 is a schematic representation of a detailed transformer model, further shown in reduced form in accordance with the invention.

The detailed model is suggested in FIG. 3(a) and it represents a 137 node RLC network. In FIG. 3(b) the reduced transformer model is shown, and consists of a passive network which connects boundary (terminal) nodes with time dependent current sources. This terminal (reduced) transformer model, at most, may provide equivalent transient voltage versus time and impedance versus frequency response when comparisons are made. By comparing the responses of these two models the accuracy of the reduction method can be established. The following comparisons were performed:

Frequency Domain Tests
   a) Short circuit admittance functions.
   b) Open circuit voltage transfer function.

Time Domain Tests
   a) Step function response.
   b) Wave responses: full wave, chopped wave, and switching surge wave.

The response comparison between both the detailed and reduced models were performed using the transient analysis program used to design the insulation structure for the transformer. This transient analysis program is similar to EMTP and is based on the same methodology. The transient analysis program was modified according to FIG. 2.

Frequency Domain Tests

Specifications require transformer manufacturers to perform short and open circuit tests on power transformers. These tests have been simulated on the detailed and reduced models and the comparison of their responses provides insight into the accuracy of the reduction method.

Figure 4:
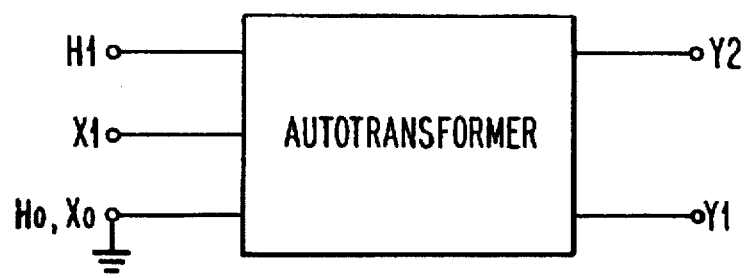
FIG. 4 is a block diagram of an autotransformer.

In FIG. 4 the block diagram for the autotransformer with tertiary is shown. By applying sine waves at terminal H1 at different frequencies, and leaving for instance terminals X1 and Y2 opened, it is possible to compare the responses of the detailed and reduced models at these terminals.

Figure 5:
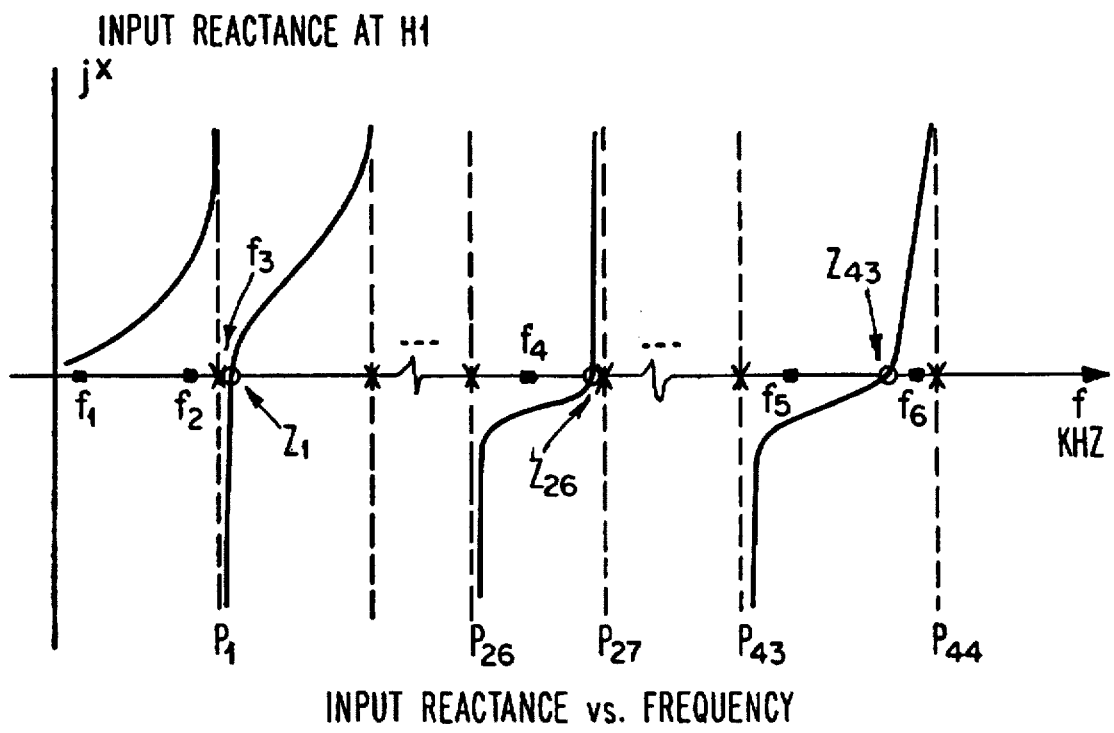
FIG. 5 is a graph of input reactance versus frequency of the autotransformer depicted in FIG. 4.

FIG. 5 (not to scale) shows the input reactance at terminal H1 as a function of frequency with several poles and zeros below 200 kHz. For instance, the first p1 is located at 1.61 kHz and pole p44 is at 194.39 kHz. The first zero z1 is located very close to pole p1 at 1.61 kHz and the zero z43 occurs at 192.42 kHz [13].

Six frequencies have been chosen for comparison purposes in the range from 60 Hz to 200 kHz and are indicated in FIG. 5. For instance, f1 is at 60 Hz, and f6 is at 192.5 kHz. It can be seen that f1 and f2 are located where the transformer is predominantly inductive, and frequencies f4 and f5 correspond to a capacitive response. The last test frequency, f6, has been chosen where the input impedance is inductive.

Some results comparing the transfer functions of the detailed and reduced tests are shown in Tables I and II. In order to demonstrate the capability of the parallel modeling method to handle losses, a dc power loss of 0.3% has been assumed for both models. It should be mentioned that the lack of a more complex damping model in the reduced model is not a shortcoming of this reduction methodology but the starting point, e.g., the detailed model.

Tables I and II show the comparison between the detailed and the reduced model for terminals X1 and Y2, respectively. The relative error is due to numerical errors, round-off and truncation errors, and is less than 0.65% in all observed cases.

TABLE I

VX1/VH1 TRANSFER FUNCTION

| KHZ | DETAILED | REDUCED | ERROR (%) |
|---|---|---|---|
| 0.60000000E–01 | 0.38373880E+00 | 0.38545940E+00 | 0.44837811E+00 |
| 0.15000000E+01 | 0.38546114E+00 | 0.38548226E+00 | 0.54775501E–02 |
| 0.16100000E+01 | 0.38745960E+00 | 0.38548421E+00 | 0.50983160E+00 |
| 0.95000000E+02 | 0.40138317E+00 | 0.40140805E+00 | 0.61986172E–02 |
| 0.18700000E+03 | 0.40881042E+00 | 0.40880239E+00 | 0.19639003E–02 |
| 0.19250000E+03 | 0.38566589E+00 | 0.38565358E+00 | 0.31918591E–02 |

TABLE II

VY2/VH1 TRANSFER FUNCTION

| KHZ | DETAILED | REDUCED | ERROR (%) |
|---|---|---|---|
| 0.60000000E–01 | 0.39913185E–01 | 0.40134430E–01 | 0.55431704E+00 |
| 0.15000000E+01 | 0.40165008E–01 | 0.40169920E–01 | 0.12229499E–01 |
| 0.16100000E+01 | 0.40436583E–01 | 0.40174816E–01 | 0.64735185E+00 |
| 0.95000000E+02 | 0.52279479E–02 | 0.52271254E–02 | 0.1573164E–012 |
| 0.18700000E+03 | 0.16633057E–01 | 0.16632217E–01 | 0.50502676E–02 |
| 0.19250000E+03 | 0.184178163–01 | 0.18416427E–01 | 0.75393555E–02 |

Figure 6:
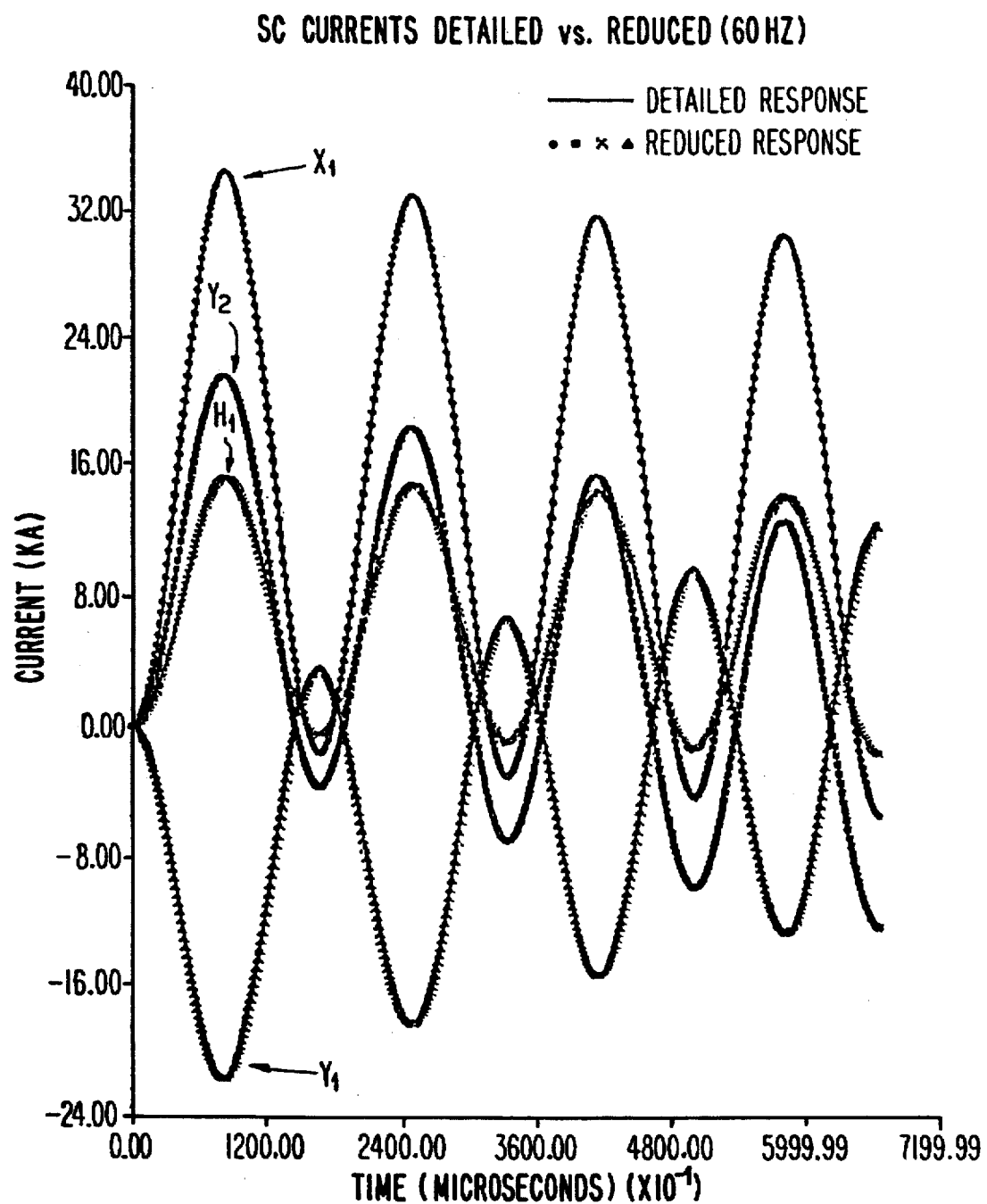
FIG. 6 is a graph of the short circuit current response of the detailed transformer model versus the transformer model reduced in accordance with the invention.

FIG. 6 shows the short circuit currents at terminals X1, Y1 and Y2, and the current at H1 for 60 Hz. Out of phase (180°) currents corresponds to tertiary terminals and the highest peak value corresponds to the short circuit current of the common (X1) terminal.

Short circuit currents have been obtained at each of the six test frequencies and the agreement is excellent between the detailed and reduced models.

Time Domain Tests

Figure 7:
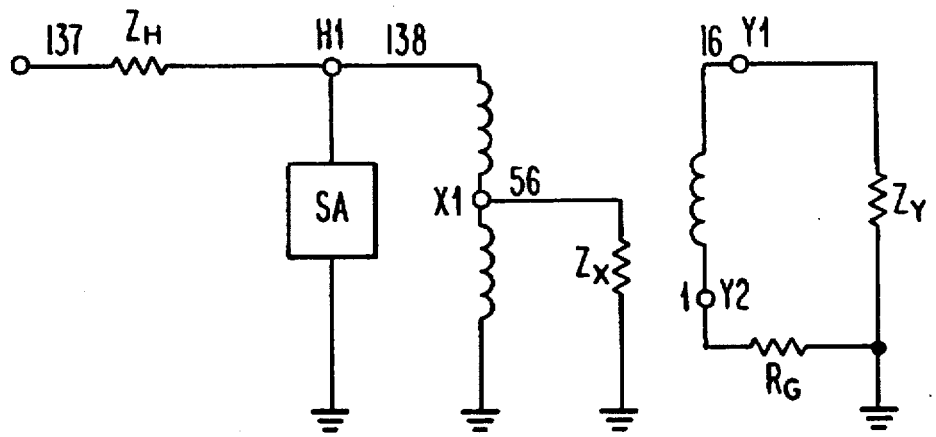
FIG. 7 is a schematic representation of the detailed transformer model which is connected to surge impedance.

Several transient voltage wave shapes were applied to both the detailed and reduced models. The transformer terminals were connected to surge impedances as indicated in FIG. 7.

Figure 8:
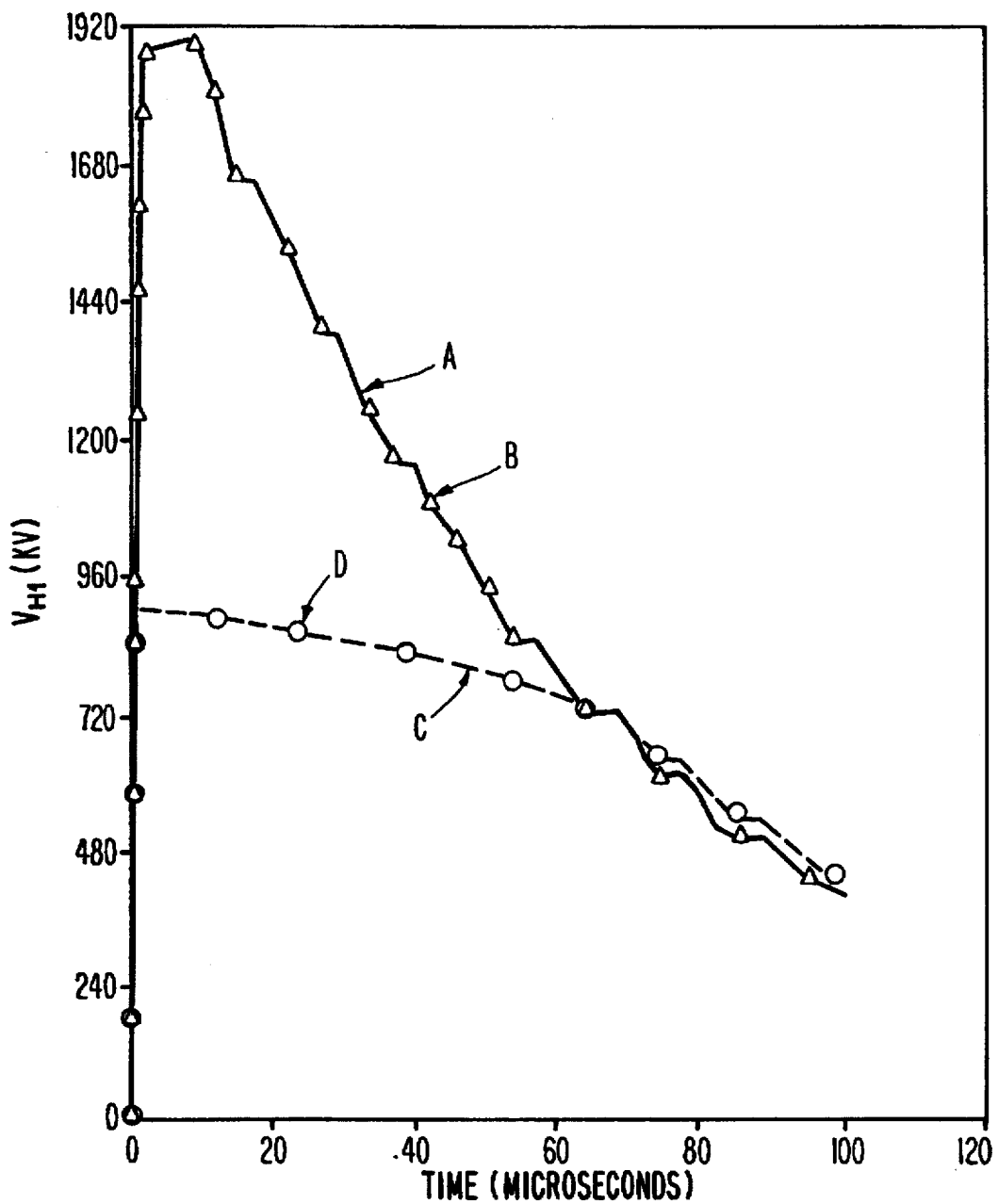
FIG. 8 is a graph showing the difference between detailed and reduced transformer model responses to full wave excitation at the high voltage terminal.
Figure 9:
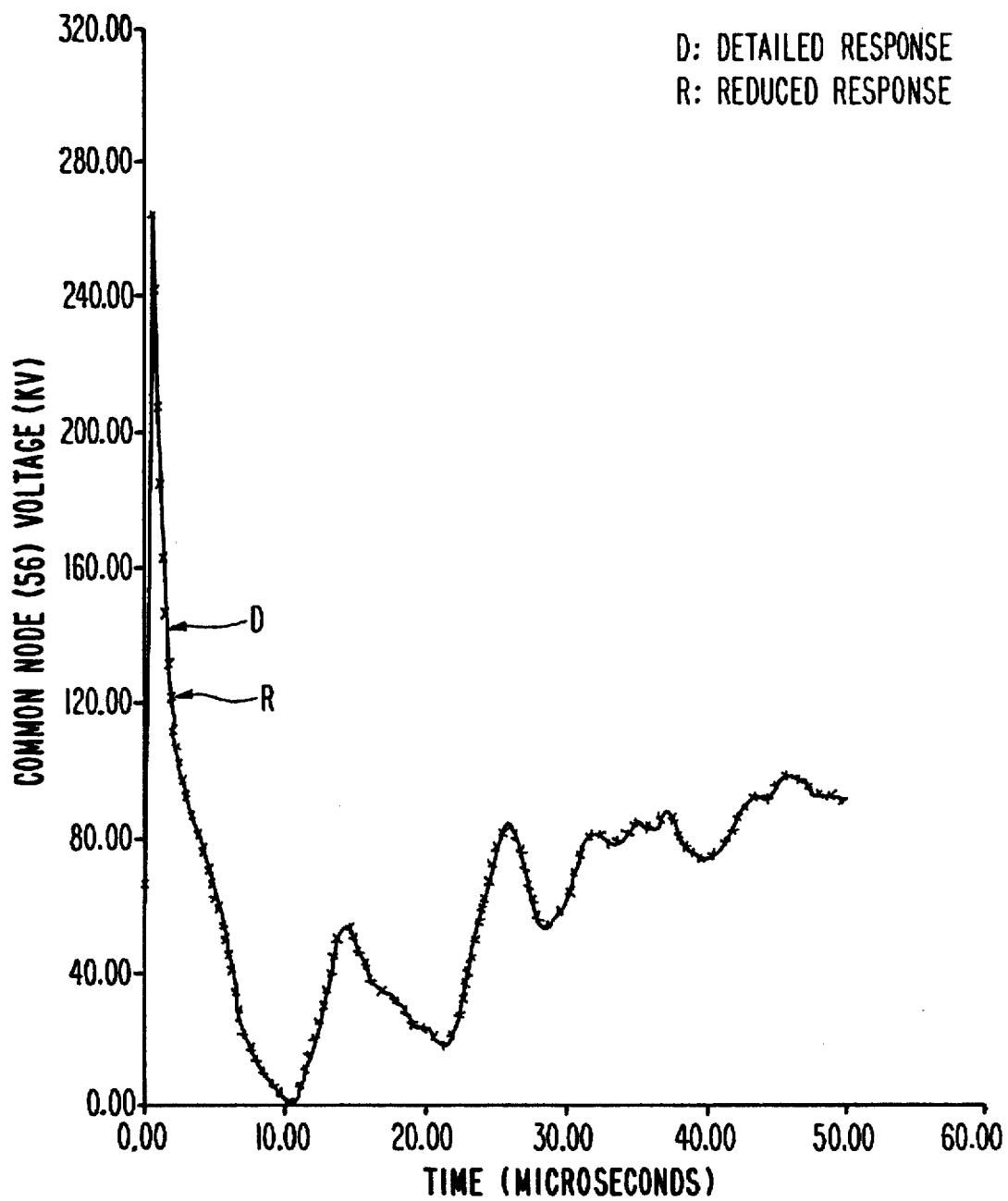
FIG. 9 is a graph showing the difference between detailed and reduced transformer model responses to full wave excitation at the common node.
Figure 10:
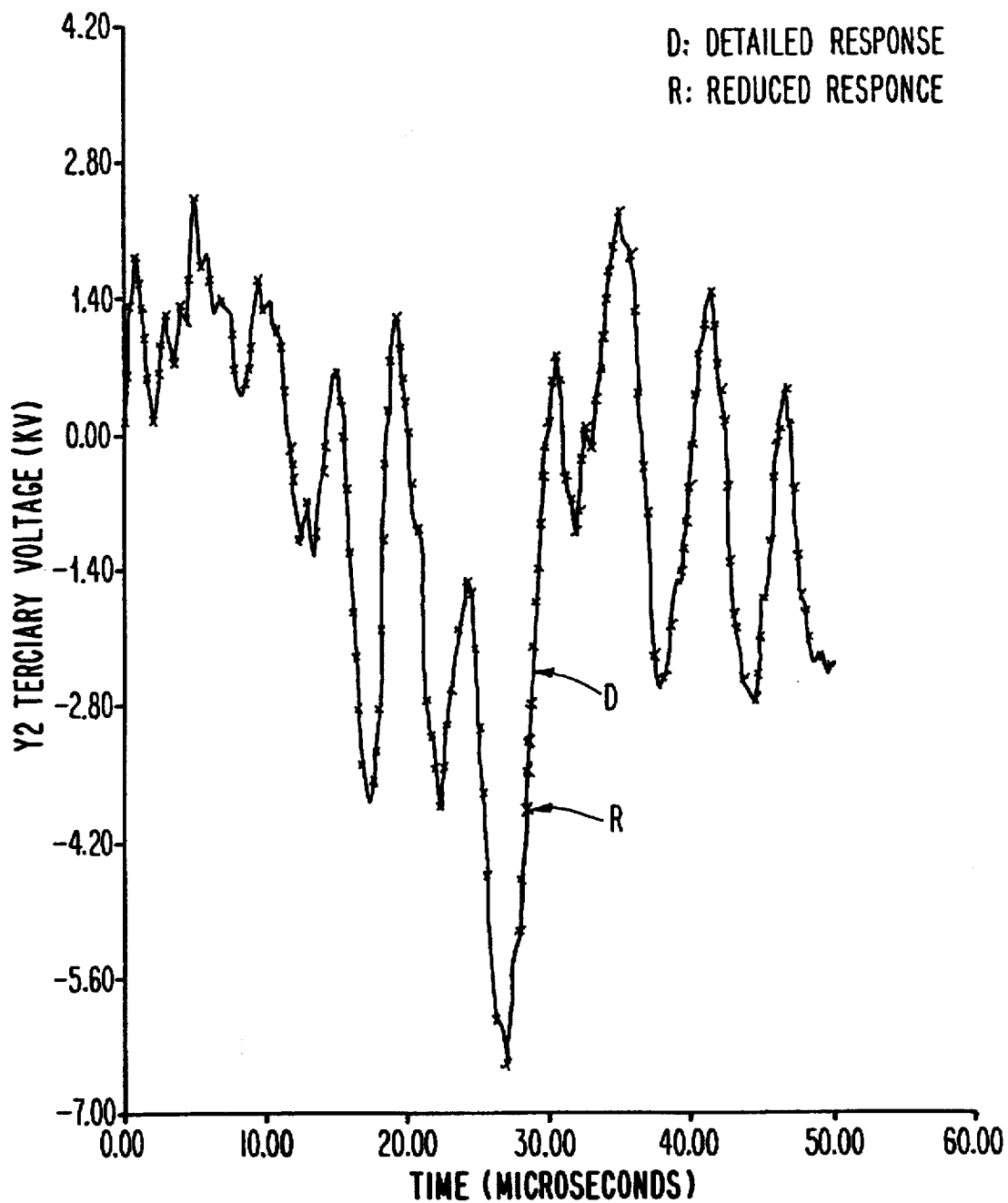
FIG. 10 is a graph showing the difference between detailed and reduced transformer model responses to full wave excitation at the tertiary node.

Additionally, a ZnO lightning arrester was connected at the H1 terminal. The response at node 136 of the detailed and reduced models are compared in FIG. 8 for a standard impulse wave (2050 kV, 1.2/50 μs), applied to node 137. The lower and upper pair of curves corresponds to the response with and without a surge arrester at the high voltage terminal (node 136), respectively. Other terminal responses are compared in FIGS. 9 and 10.

Figure 11:
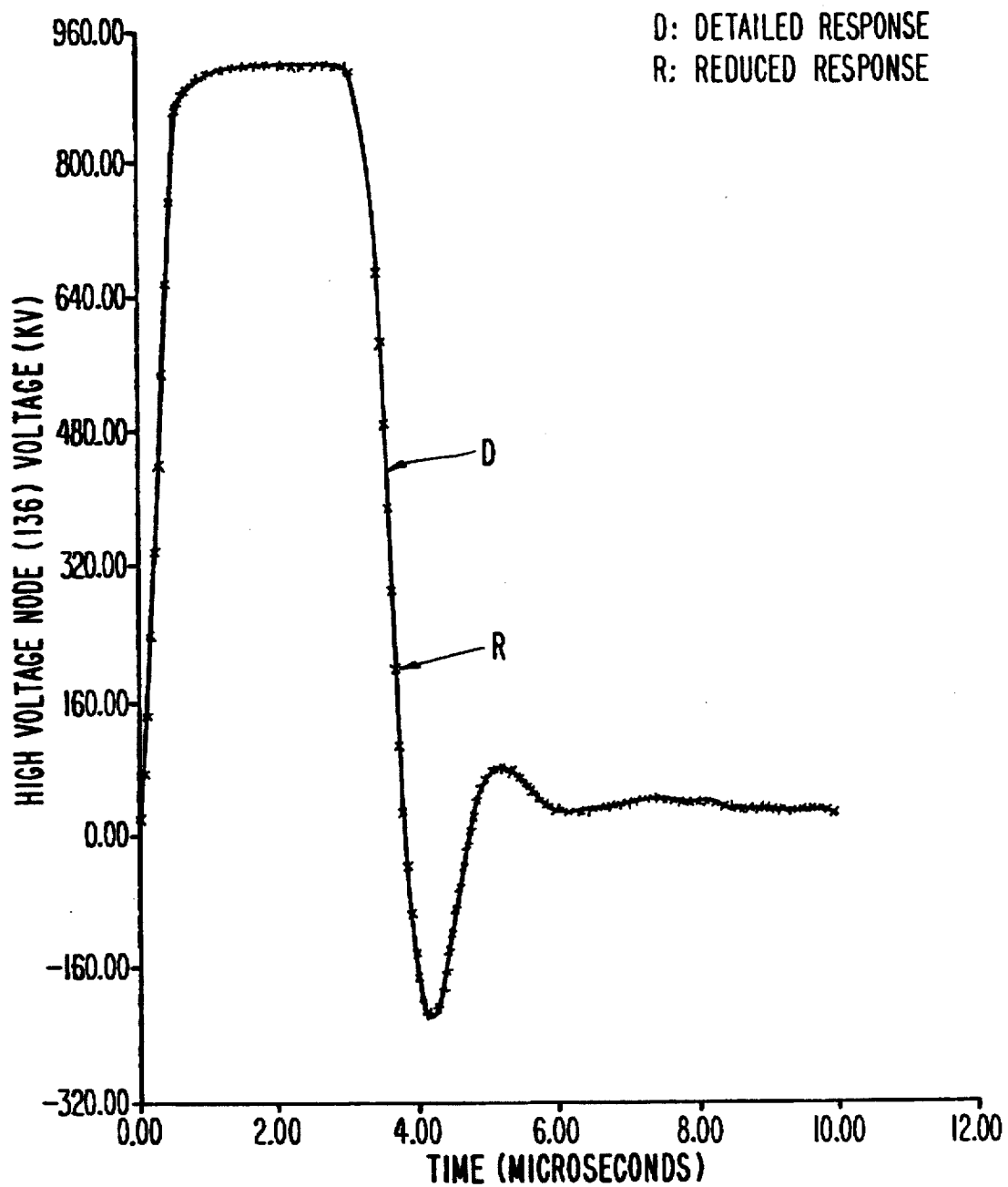
FIG. 11 is a graph showing the difference between detailed and reduced transformer model responses to chopped wave excitation at the high voltage terminal.
Figure 12:
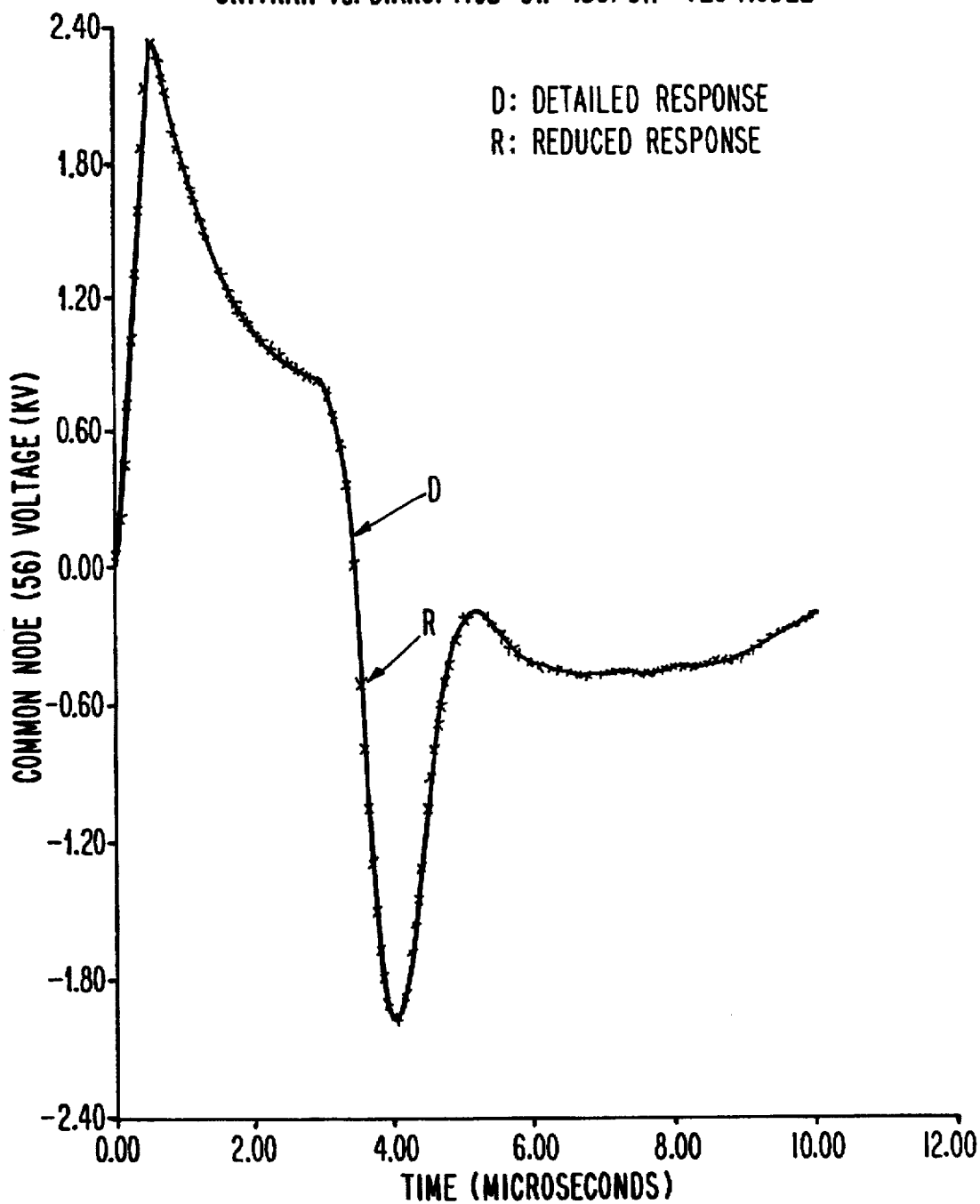
FIG. 12 is a further graph showing the difference between detailed and reduced transformer model responses to chopped wave excitation at the common node.
Figure 13:
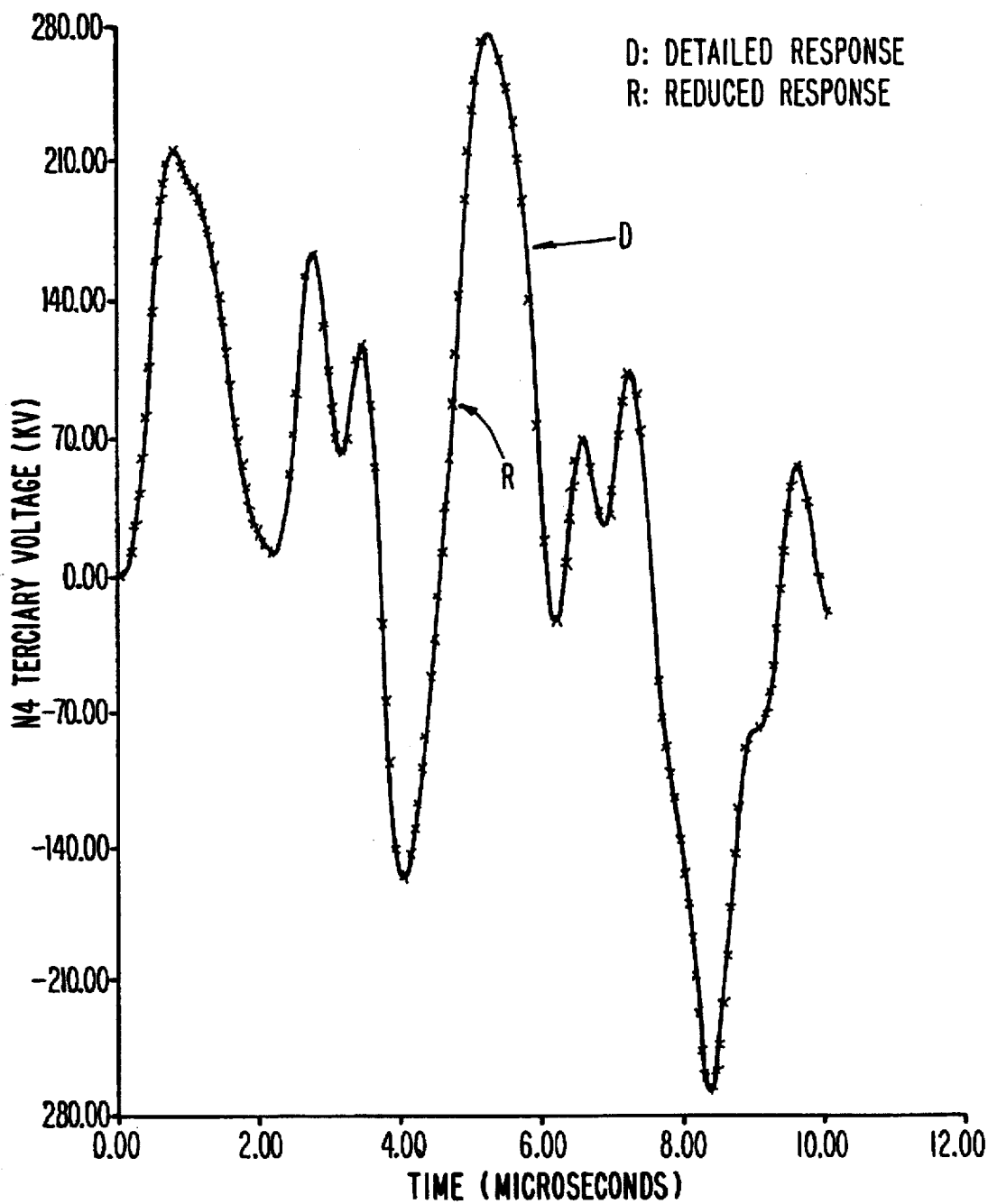
FIG. 13 is a still further graph showing the difference between detailed and reduced transformer model responses to chopped wave excitation at the tertiary node.

FIGS. 11, 12 and 13 show the comparison between the detailed model response and the reduced model response at H1, X1 and Y2 terminals, respectively, when a chopped wave (2250 kV, 1.2/50 μs chopped at 3 μs, the fall time is 0.5 μs and an undershoot of approximately 20%) is applied at node 137. Note that the lightning arrester limits the peak voltage at terminal H1 and the reduced model (cross points) follows exactly the response of the detailed model (solid line). Other wave shapes have been tested with similar agreements.

The method requires only that the retained nodes be specified.

NON-LINEAR REDUCTION

Consider now the generation and use of reduced models for non-linear components and systems. A lumped parameter network representing the non-linear transformer characteristic results in a system of ordinary differential equations that are characterized as stiff systems. These equations are difficult to solve routinely. As set forth in M. Valkilian, et al., *A Method for Modeling Nonlinear Core Characteristics of Transformers During Transients*, IEEE PES, Winter Meeting, New York (Paper 94, WM 004-2-PWRD), 1994 (incorporated herein by reference), C. W. Gear developed a solver for these type of stiff systems. As described below, Gear's solver is applied to nonlinear, lumped parameter transformer models. This system of equations form the basis of the non-linear reduction method.

The Gear method is a high order backward differences method for solving stiff systems of ordinary differential equations of the form:

$$A\dot{W} = \psi(t, W)$$

where A is a matrix that can be a function of time (t), W is a vector representing voltages, currents, etc.

The general equation describing the transformer's lumped parameter network at time t is given by:

$$\begin{bmatrix} [L] & 0 & 0 & 0 \\ 0 & [L_1] & 0 & 0 \\ 0 & 0 & [C] & 0 \\ 0 & 0 & 0 & [U] \end{bmatrix} \begin{bmatrix} [di_e/dt] \\ [di_1/dt] \\ [de_n/dt] \\ [df_e/dt] \end{bmatrix} = \begin{bmatrix} -[r] & 0 & [T]^t \\ 0 & 0 & [T_e]^t \\ -[T] & -[T_1] & -[G] \\ -[r] & 0 & [T] \end{bmatrix} \begin{bmatrix} [i_e] \\ [i_e] \\ [e_n] \end{bmatrix} - \begin{bmatrix} 0 \\ 0 \\ [I_s] \\ 0 \end{bmatrix}$$ (15)

[$i_e$]=vector of currents in the winding segments;
[$e_n$]=model's nodal voltages vector;
[$f_e$]=windings' flux-linkages vector;
[r]=the diagonal matrix of windings series resistance;
[T]=the windings connection matrix;
[T]$^t$=the transpose of [T];
[C]=the modal capacitance matrix;
[U]=a unity matrix;
[$I_s$]=vector of current sources;
[$L_1$]=diagonal matrix of external lumped inductor;
[L]=winding inductance matrix;
[$T_1$]=connection matrix of external lumped inductor;
[$i_1$]=vector of currents in the external lumped; inductor; and
[G]=conductance matrix, for resistors connected between nodes.

In a linear representation of an iron core transformer, the permeability of the core is assumed constant regardless of the magnitude of the core flux. This assumption allows the inductance model to remain constant for the entire computation. If the core is nonlinear, the permeability changes as a function of the material properties, past history and instantaneous flux magnitude. The associate inductance model is, thus, time dependent.

The basic strategy for solving the transient response of the nonlinear model in equation 15 is to linearize the transformer's nonlinear magnetic characteristics at an instant of time based on the flux in the core at that instant. As an approximation, a transformer's reluctivity (v) can be assumed constant during the interval [t, t+$\Delta$t]. In other words, the inductance matrix can be linearized at an instant of time, such that the inductance matrix is considered constant for the interval [t, t+$\Delta$t]. When the trapezoidal rule of integration is applied to the describing differential equations of the RLC network, which represents the linearized detailed transformer model, a set of algebraic equations results. This set of algebraic equations represents the linearized detailed transformer model for the interval [t, t+$\Delta$t]. It is noted that all unknown functions of time, i.e., voltages currents, etc., remain constants in the right side open interval [$t_0$, $t_0$+$\Delta$t] and these functions change only at the end of each $\Delta$t.

When the detailed nonlinear transformer model is linearized at time t, a corresponding reduced model can be obtained by applying the linear reduction technique outlined above. This reduced linear model can be used in transient programs based on stiff ODE solvers like Gear's method referenced previously. To avoid the reduction process at every time step a family of reduced transformer models, as a function of the time step size and reluctivity, can be computed and expressed in a bidimensional cubic spline form. The expression of bidimensional cubic spline relationships is disclosed in C. DeBoor, *A Practical Guide to Splines*, Springer Verlag, New York (1978) (incorporated herein by reference).

The nonlinear reduction method described here combines the trapezoidal rule of integration with the Gear solution routine. This combination takes advantage of the strength of Gear's method for solving stiff differential equation systems and it utilizes the trapezoidal rule of integration so that the Kron reduction technique, referenced above, can be applied. This arrangement yields a reduced model that retains the characteristics of the detailed nonlinear transformer model.

In EMTP the solution process and the trapezoidal rule of integration result in a set matrix equation of conductance, voltage, and injected currents (which depend upon the history of the circuit). Equally valid expressions for an RLC network are inductance, integral of voltage, and current or, alternately, capacitance, derivative of voltage, and current. The appropriate form should be selected based on the problem at hand. Since Gear's method is based on the state variable method, the most appropriate form is capacitance, derivative of the voltage, and injected current. This combination yields a reduced set of differential equations of the form $$[Y][\dot{V}] = [\phi(t, V)]$$

which can be solved with the Gear method; where V represents the first derivative of the voltage vector at retained nodes, t represents time, and [Y] stands for the reduced time domain nodal admittance matrix for the power transformer.

The reduced transformer model at time t can be described by the following equation:

$$[\bar{Y}_r][\dot{V}_r] = [I_r] - [\bar{H}_v]$$ (15a)

Where:

$$[\bar{Y}_r] = \begin{bmatrix} Y_{Vii} & Y_{Vib} \\ Y_{Vbi} & Y_{Vbb} \end{bmatrix}$$

$$[\dot{V}_r] = [\dot{V}_i^t \; \dot{V}_b^t]^t$$

$$[I_r] = [0^t \; I_b^t]^t$$

$$[\bar{H}_v] = [\bar{H}^t_{Vi} \; \bar{H}^t_{Vb}]^t$$

Equation 15a is formulated in the derivative of voltage form. Note that the time domain nodal admittance matrix for the transformer changes as a function of time and permeability. Subscripts i and b represent internal nodes to be retained and boundary nodes, respectively. Subscript r represents retained nodes, either internal or boundary.

The power system which contains the transformer is described by equation 16.

$$\begin{bmatrix} Y_{BB} & Y_{BE} \\ Y_{EB} & Y_{EE} \end{bmatrix} \begin{bmatrix} V_B \\ V_E \end{bmatrix} = \begin{bmatrix} I_B + I_\beta \\ I_E \end{bmatrix} - \begin{bmatrix} H_B \\ H_E \end{bmatrix}$$ (16)

Subscripts B refers to the boundary nodes on the system-transformer interface. Subscript E refers to nodes within the power system and not connected to the transformer. These nodes are of two types. Those that are sources are node type S and all other external nodes are type e. The term [$I_\beta$] accounts for any nonlinear element (i.e. surge arrester) or sources connected directly to the transformer terminals.

Equation 16 can be reordered so that external power system nodes are divided into two groups; nodes associated with sources, where voltages [$V_S$] are known at any instant of time, and external nodes with zero injected current. This form of the equation yields:

$$\begin{bmatrix} Y_{BB} & Y_{BS} & Y_{Be} \\ Y_{SB} & Y_{SS} & Y_{Se} \\ Y_{eB} & Y_{eS} & Y_{ee} \end{bmatrix} \begin{bmatrix} V_B \\ V_S \\ V_e \end{bmatrix} = \begin{bmatrix} I_B + I_\beta \\ I_S \\ 0 \end{bmatrix} - \begin{bmatrix} H_B \\ H_S \\ H_e \end{bmatrix} \quad (17)$$

Where:

$$[Y_{EE}] = \begin{bmatrix} Y_{SS} & Y_{Se} \\ Y_{eS} & Y_{ee} \end{bmatrix}$$

$[Y_{EB}] = [Y_{BS}\ Y_{Be}]^t$ $[Y_{BE}] = [Y_{EB}]^t$ $[V_E] = [V_S^t\ V_e^t]^t$ $[I_E] = [I_S^t\ 0^t]^t$ $[H_E] = [H_S^t\ H_e^t]^t$

Applying Kron reduction technique to equation 17 yields:

$[Y_{RBB}][V_B] + [Y_{RBE}][V_S] = [I_B] + [I_\beta] - [H_{RB}] \quad (18)$ with:

$[Y_{RBB}] = [Y_{BB}] - [Y_{Be}][Y_{ee}]^{-1}[Y_{eB}]$ $[Y_{RBE}] = [Y_{BS}] - [Y_{Be}][Y_{ee}]^{-1}[Y_{eS}]$ $[H_{RB}] = [H_B] - [Y_{Be}][Y_{ee}]^{-1}[H_e]$

The relationship between the voltage and currents at the boundary nodes are:

$[V_b] = [V_B] \quad (19)$ $[I_b] = [-I_B] \quad (20)$

Using equations 18, 19 and 20 the entire power system model can be described by equation 15a with the boundary current vector given by:

$[I_b] = [I_\beta] - [Y_{RBB}][V_b] - [Y_{RBE}][V_S] - [H_{RB}] \quad (21)$

Figure 14:
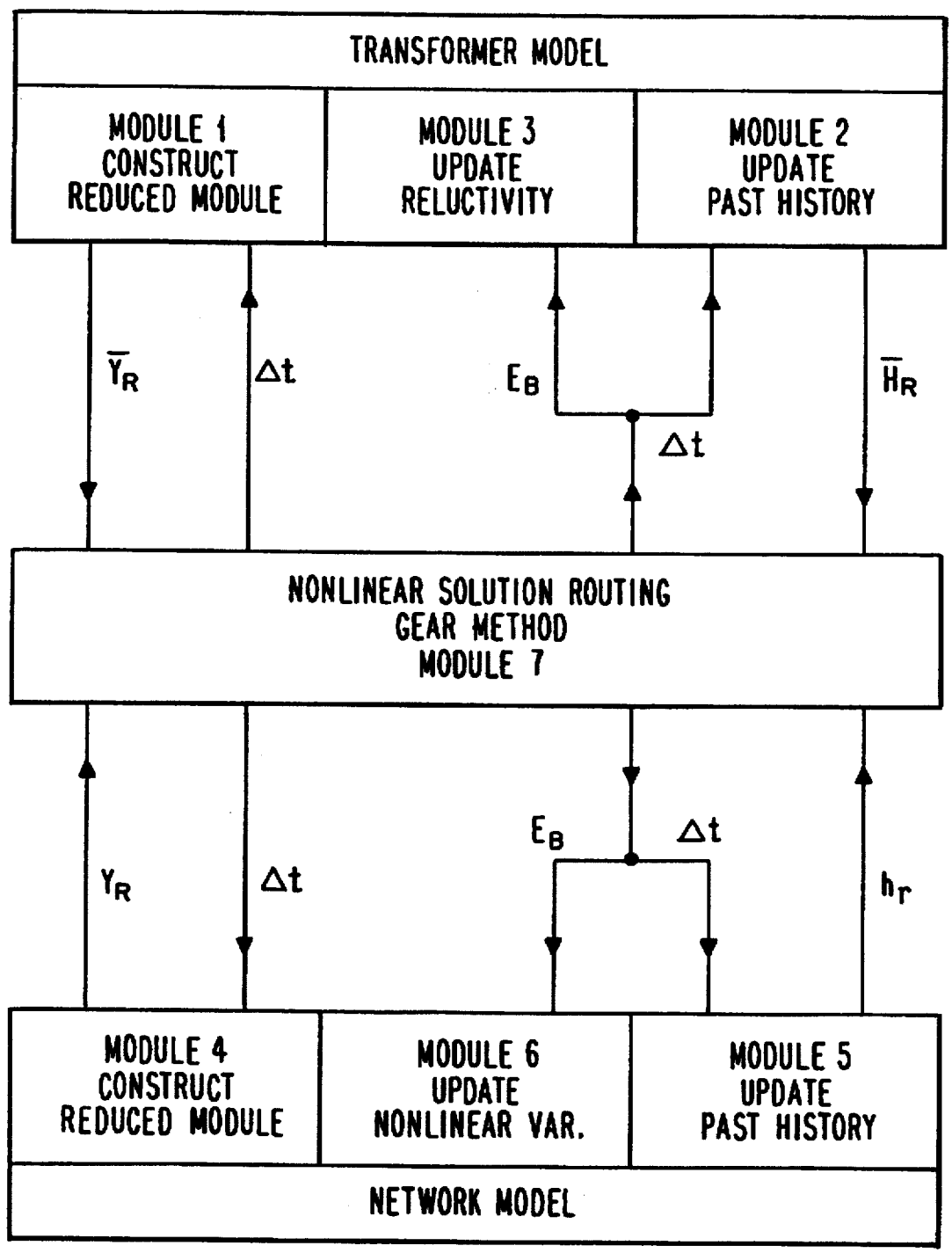
FIG. 14 is a detailed block diagram of a non-linear transformer/system similar to that depicted in FIG. 1.

A simplified block diagram of the nonlinear reduction method is shown in FIG. 14. This nonlinear method combines the reduced transformer model and its associated network model and uses the Gear method as the transient solution routine.

The reduced model of the transformer and its associated network are composed of seven modules of computer software as diagrammatically shown in FIG. 14. Module 1 and 4 reduce the detailed transformer model and the system model, respectively by applying the Kron reduction technique described above. Module 2 and 5 update the past history current vector for the transformer and system, respectively. Module 3 and 6 updates the nonlinear functions for both the transformer and the system.

Modules 1 and 4 update the reduced admittance models of the transformer and the system network at each time step. The transformer reduced model is formulated in a derivative of the voltage form which provides the equivalent capacitive network. The network reduced model is formulated in voltage form (EMTP form) and provides the equivalent conductance network. The past history in both reduced models is represented by time dependent current sources.

At time t=0 both Modules 1 and 4 pass the transformer and system reduced models into module 7 which is a nonlinear solution routine based on Gear's method. These initial reduced models are functions of the initial conditions, i.e., initial time step, reluctivity, voltages, etc. The module 7 solution routine automatically selects the appropriate time step size, and the reduced models are updated whenever the size of the Gear time step changes. Modules 2 and 5 update the past history currents at the end of each Gear time step and also when the size of the time step changes. The past history is a function of the variables (voltages, currents, etc.) at the end of the previous time step, and also is a function of the actual Gear time step size. Modules 3 and 6 update independent variables of nonlinear functions, i.e., reluctivity, at the end of every Gear time step, once boundary voltages are available.

Figure 15:
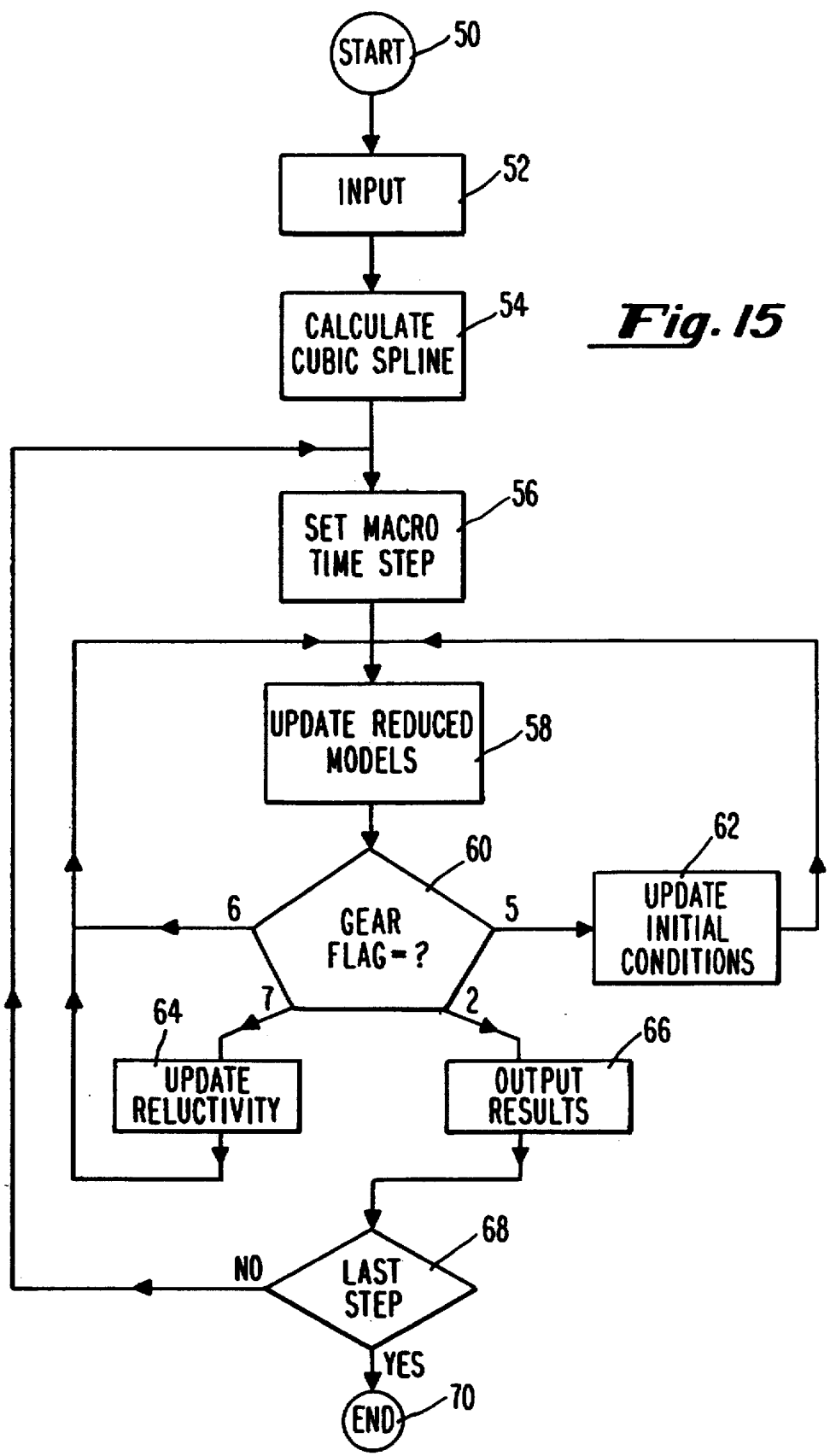
FIG. 15 is a flow diagram of a computer program incorporating the present invention.

FIG. 15 shows a high level flow chart of the nonlinear parallel modeling method as implemented in software for the manipulation of the general purpose computer referenced previously. At 50 the program starts. At 52 the particulars of the transformer to be modeled are entered. At 54, the family of reduced transformer models, described above as a function of the time step size and reluctivity, are computed using the Kron reduction technique described above and expressed in a bidimensional cubic spline form. The bidimensional cubic spline form saves the reduced transformer time domain nodal admittance [$Y_R$] as a function of $\Delta t$ and reluctivity. At 56 the macro time step, or the period of time at the end of which the solution response is desired, is set. At 58 the reduced models are updated. At 60 the reduced models are solved using the Gear method described above. The Gear routine selects the order of the backward difference method and the appropriate size of the micro time step. At each trial, the reduced models are updated until the tolerance requirements are met. It will be appreciated that use of the Gear methodology will result in various flag values being generated. Depending on the particular flag value certain operations will be carried out. When the flag value equals 6, the reduced models are updated. When the flag value equals 5, the initial conditions are updated. When the flag value equals 7, the reluctivity values are updated. Once the voltages are updated, then the boundary currents, the winding segment currents and flux linkages are calculated by applying the trapezoidal rule of integration. When the flag value equals 2, the results of the Gear solution are output. After the results are output, if there are no further time steps, the program ends. If further time steps exist, the program returns to update the reduced models.

EXAMPLE 2

The transformer used in this example is a 765/345/34.5 kV, 500 MVA, YYΔ, single phase autotransformer constructed by ABB for AEP. The nonlinear model for this transformer contains 26 nodes.

Figure 16:
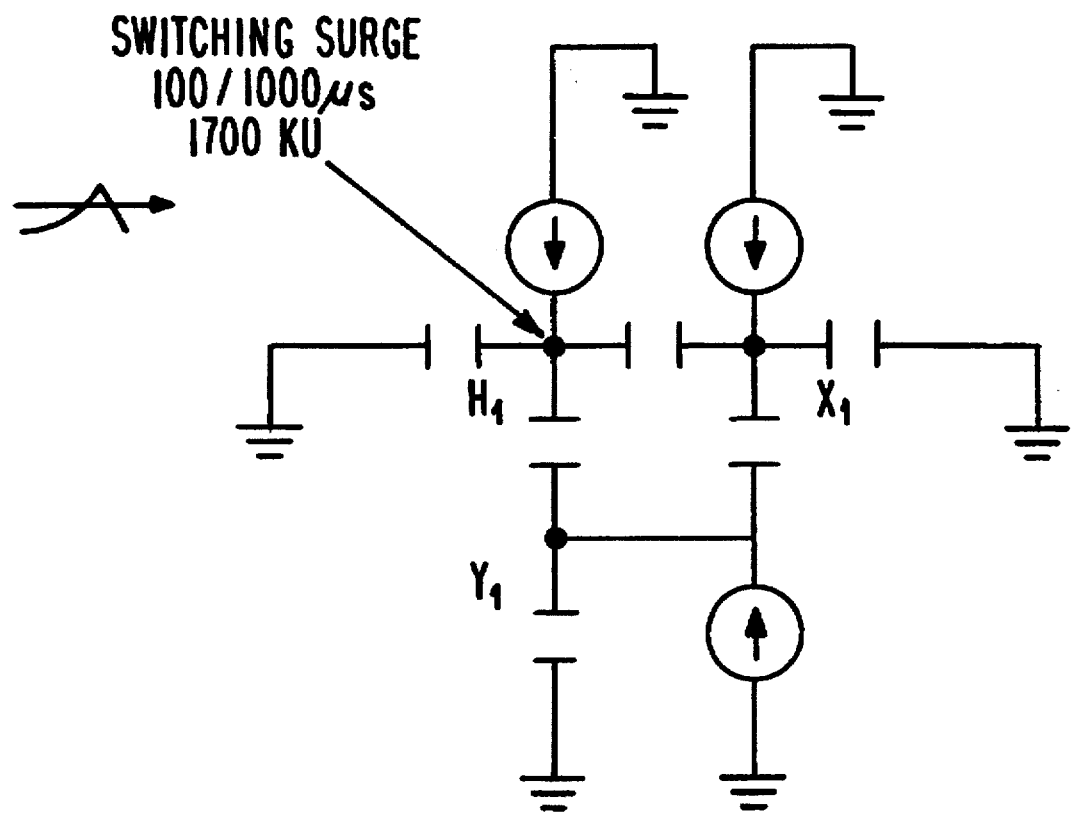
FIG. 16 is an example of a schematic representation of a non-linear transformer model reduced in accordance with the invention for the autotransformer shown in FIGS. 3 and 4.

The detailed nonlinear transformer model is an RLC network formed by self and mutual inductances (reluctivity functions), capacitances and resistances. This model is represented by a time domain admittance obtained by applying the trapezoidal rule of integration to the describing equations of the model in derivative of the voltage form. FIG. 16 shows the corresponding nonlinear reduced transformer model, which is obtained by the application of Kron's reduction method to the transformer.

Both models, detailed and reduced, are excited by a double exponential switching surge of 1700 kV 100/1000 µs. The responses of both models are compared at the common node, $X_1$, and tertiary, $Y_1$, terminals.

Figure 17:
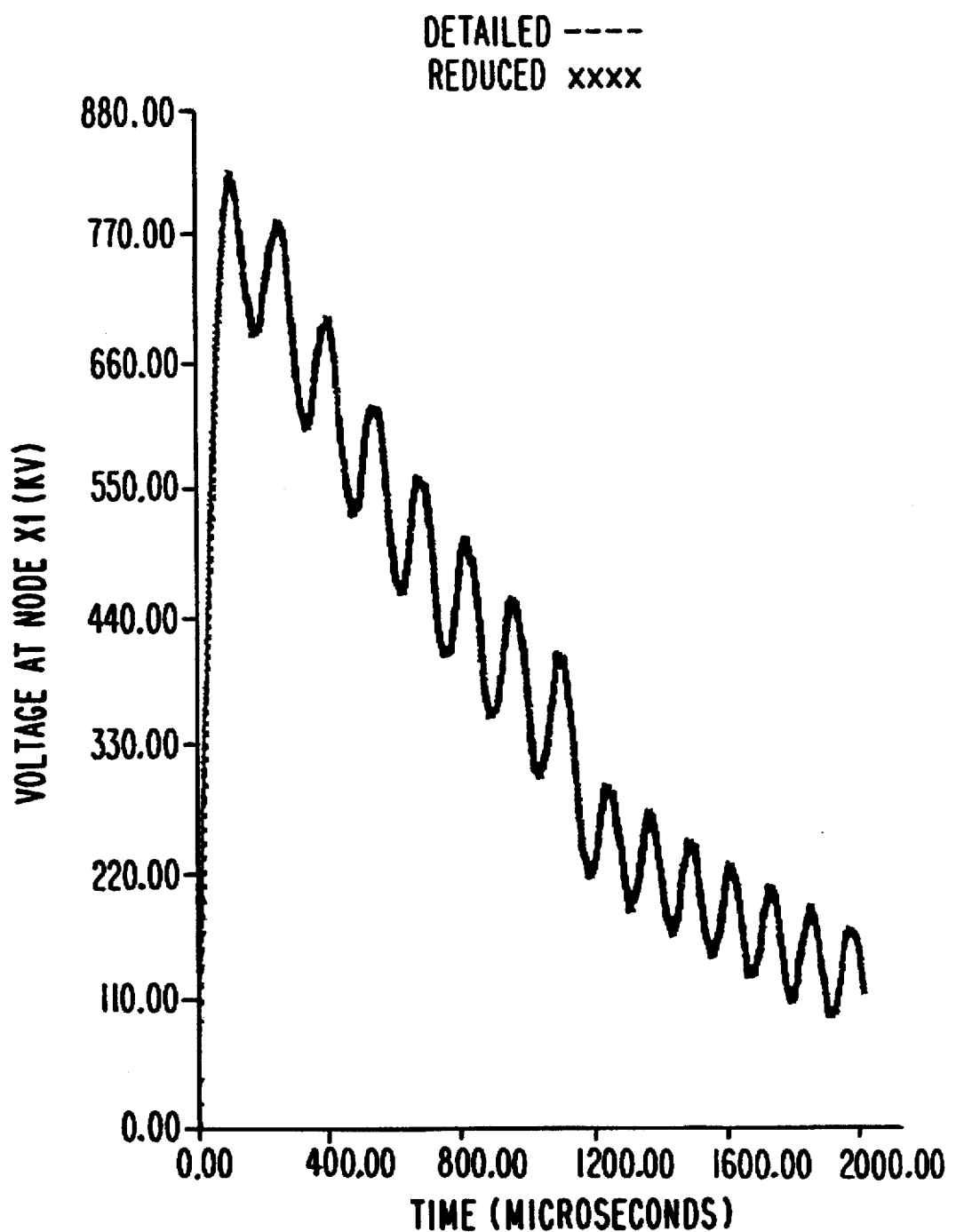
FIG. 17 is a graph showing the difference between detailed and reduced non-linear transformer model responses to full wave excitation at the common node.
Figure 18:
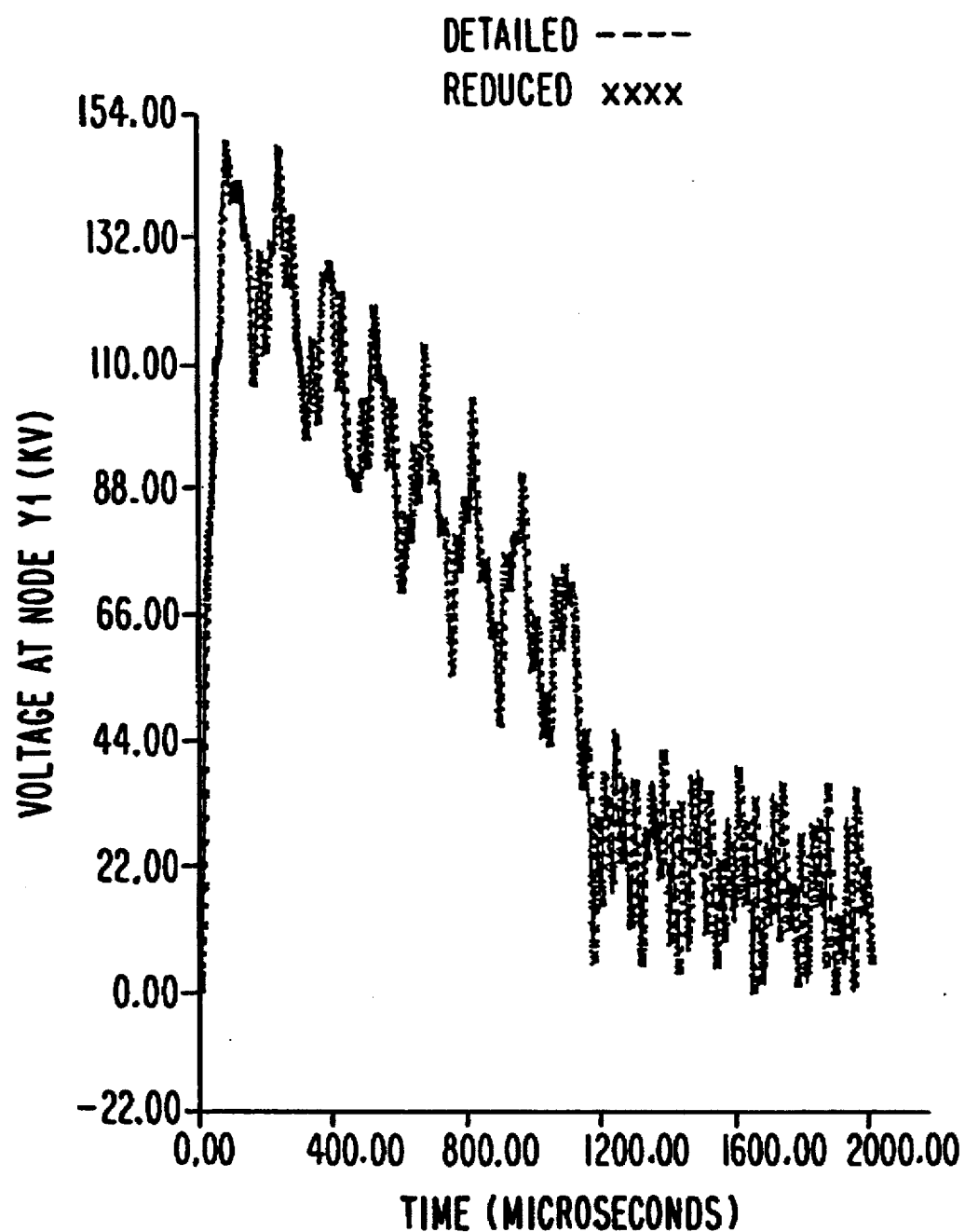
FIG. 18 is a further graph showing the difference between detailed and reduced transformer model responses to full wave excitation at the tertiary node.

FIG. 17 compares the response of the detailed and reduced models at terminal $X_1$ for the open circuit case. Both wave forms are essentially the same. The drastic change in wave form at 1200 μs is caused by core saturation. FIG. 18 shows a comparison of response for the open circuit case at the tertiary. While the voltages are relatively small, the very close agreement between the two calculations demonstrates the accuracy of the invention.

There is a need for accurate nonlinear reduced order transformer model suitable for power system studies. Existing reduction methods demonstrate the lack of a suitable nonlinear reduction method. The invention starts with the detailed nonlinear lumped transformer model. The reduced model retains only the nodes of interest, while maintaining the accuracy of the detailed model.

The nonlinear detailed model is linearized at an instant of time and is reduced by Kron's reduction technique. This reduction process is accomplished outside of the solution routine and a family of reduced models are obtained as a function of the time step size and magnetic permeability. This family of reduced transformer models with the power system reduced model are solved by a suitable nonlinear routine (i.e. Gear method). The nonlinear parallel method provides the interface between the power system reduced models and the Gear solution routine.

While the invention has been described and illustrated with reference to specific embodiments, those skilled in the art will recognize that modification and variations may be made without departing from the principles of the invention as described herein above and set forth in the following claims.

What is claimed is:

1. A system for generating a reduced, computer-readable matrix model of a component of a system for use in analyzing said component, said component being initially represented by an equation model, comprising:

a computer; and a computer-readable storage medium operatively coupled to said computer and containing:

(1) a first matrix model of said component, wherein said matrix model contains parameter values and is representative of said equation model;

(2) first code means for linearizing a portion of said first matrix model, thereby forming a second matrix model;

(3) second code means for reordering and reducing said second matrix model by eliminating certain of said parameter values, whereby said reduced model is formed; and wherein both the first matrix model and the reduced model provide predictions of the performance of said component, and the accuracy of said reduced model is substantially identical to that of said first matrix model.

2. The system of claim 1, further comprising third code means contained in said storage medium for forming a series of reduced matrix models.

3. The system of claim 2, further comprising fourth code means for forming said series of reduced matrix models in a bidimensional cubic spline.

4. The system of claim 1, wherein said first matrix model comprises an inductance matrix and wherein the first code means for linearizing a portion of said first matrix model comprises means for linearizing said inductance matrix.

5. The system of claim 4, wherein said means for linearizing said inductance matrix comprises means for holding the inductance matrix constant for a given instant of time.

6. The system of claim 1, further comprising means for modifying said reduced model to account for historical information of certain parameters represented in said reduced model.

* * * * *

UNITED STATES PATENT AND TRADEMARK OFFICE
CERTIFICATE OF CORRECTION

PATENT NO. : 5,692,158
DATED : November 25, 1997
INVENTOR(S) : Robert C. Degeneff et al.

It is certified that error appears in the above-indentified patent and that said Letters Patent is hereby corrected as shown below:

Col. 16, at line 48, following the preceding equaltions, insert --[·]= first derivative respect time--

Signed and Sealed this

Third Day of February, 1998

Attest:

BRUCE LEHMAN

*Attesting Officer*      Commissioner of Patents and Trademarks